(12) United States Patent
Hirasozu et al.

(10) Patent No.: US 8,507,985 B2
(45) Date of Patent: Aug. 13, 2013

(54) SEMICONDUCTOR DEVICE

(75) Inventors: Hirofumi Hirasozu, Kanagawa-ken (JP); Kimihiko Deguchi, Kanagawa-ken (JP); Manji Obatake, Kanagawa-ken (JP); Tomoko Matsudai, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 302 days.

(21) Appl. No.: 13/052,027

(22) Filed: Mar. 18, 2011

(65) Prior Publication Data
US 2011/0303979 A1 Dec. 15, 2011

(30) Foreign Application Priority Data

Jun. 10, 2010 (JP) .................................. 2010-133426

(51) Int. Cl.
*H01L 29/78* (2006.01)
(52) U.S. Cl.
USPC .... 257/339; 257/342; 257/343; 257/E29.256; 438/279
(58) Field of Classification Search
USPC .......... 257/339, 341–343, E29.256, E29.261; 438/279
See application file for complete search history.

(56) References Cited

U.S. PATENT DOCUMENTS
2004/0251492 A1* 12/2004 Lin ................................ 257/335

FOREIGN PATENT DOCUMENTS
JP 2007-088369 4/2007

OTHER PUBLICATIONS

S. Yanagi et al., "0.15μm BiC-DMOS technology with novel Stepped-STI N-channel LDMOS", ISPSD Jun. 14-17, 2009, pp. 80-83.
S. Merchant et al., "Realization of High Breakdown Voltage (> 700 V) in Thin SOI Devices", 1991 IEEE, pp. 31-35.
T. Matsudai et al., "Thin SOI IGBT leakage current and a new device structure for high temperature operation", Proc. of the 6th Internet Symposium on Power Semiconductor Devices & IC's. Davos, Switzerland May 31-Jun. 2, 1994. Session 9: IGBT 3 Paper 9.1 pp. 399-403.
U.S. Appl. No. 12/878,948.

* cited by examiner

*Primary Examiner* — Julio J Maldonado
*Assistant Examiner* — Daniel Shook
(74) *Attorney, Agent, or Firm* — Patterson & Sheridan, LLP

(57) ABSTRACT

According to one embodiment, a semiconductor device, includes a semiconductor layer, a first base region of a first conductivity type, a first source region of a second conductivity type, a second base region of the first conductivity type, a back gate region of the first conductivity type, a drift region of the second conductivity type, a drain region of the second conductivity type, a first insulating region, a second insulating region, a gate oxide film, a first gate electrode, a second gate electrode, a first main electrode and a second main electrode. These constituent elements are provided on the surface of the semiconductor layer. The distance between the first base region and the first insulating region is not more than 1.8 μm. The distance between the first base region and the first insulating region is shorter than a distance between the second base region and the second insulating region.

20 Claims, 17 Drawing Sheets

SEMICONDUCTOR DEVICE

CROSS-REFERENCE TO RELATED APPLICATIONS

This application is based upon and claims the benefit of priority from the prior Japanese Patent Application No. 2010-133426, filed on Jun. 10, 2010; the entire contents of which are incorporated herein by reference.

FIELD

Embodiments described herein relate generally to a semiconductor device.

BACKGROUND

One type of power metal oxide semiconductor (MOS) field effect transistor is the lateral double diffused metal oxide semiconductor (DMOS) field effect transistor. Generally, as a measure to improve the breakdown voltage of this type of DMOS field effect transistor, the length of the drift region (drift length) is extended to improve the breakdown voltage of an element. However, when the drift length is increased, there is a problem that the element area of the lateral DMOS field effect transistor is increased.

Also, in a DMOS field effect transistor, in order to make element failure due to avalanche breakdown difficult to occur, generally a back gate region with a conductivity type opposite to that of the source region is provided at the source region, as a measure to remove carriers generated by avalanche breakdown from the back gate region.

It is desirable that all source regions is provided with a back gate region, in order to effectively remove carriers generated by avalanche breakdown from the back gate region. However, if a back gate region is provided at all source regions, the element length A (distance between source and drain) becomes longer, and the on resistance (RonA) between the source and drain increases, and this has a problem that the element area increases.

A measure against this is to provide a source region without a back gate region in parts, to suppress the increase in element area and reduce the RonA. However, in this case, there is the issue that when avalanche breakdown occurs at the element region without a back gate region, there is a greater danger of element failure.

DETAILED DESCRIPTION

Figure 1:
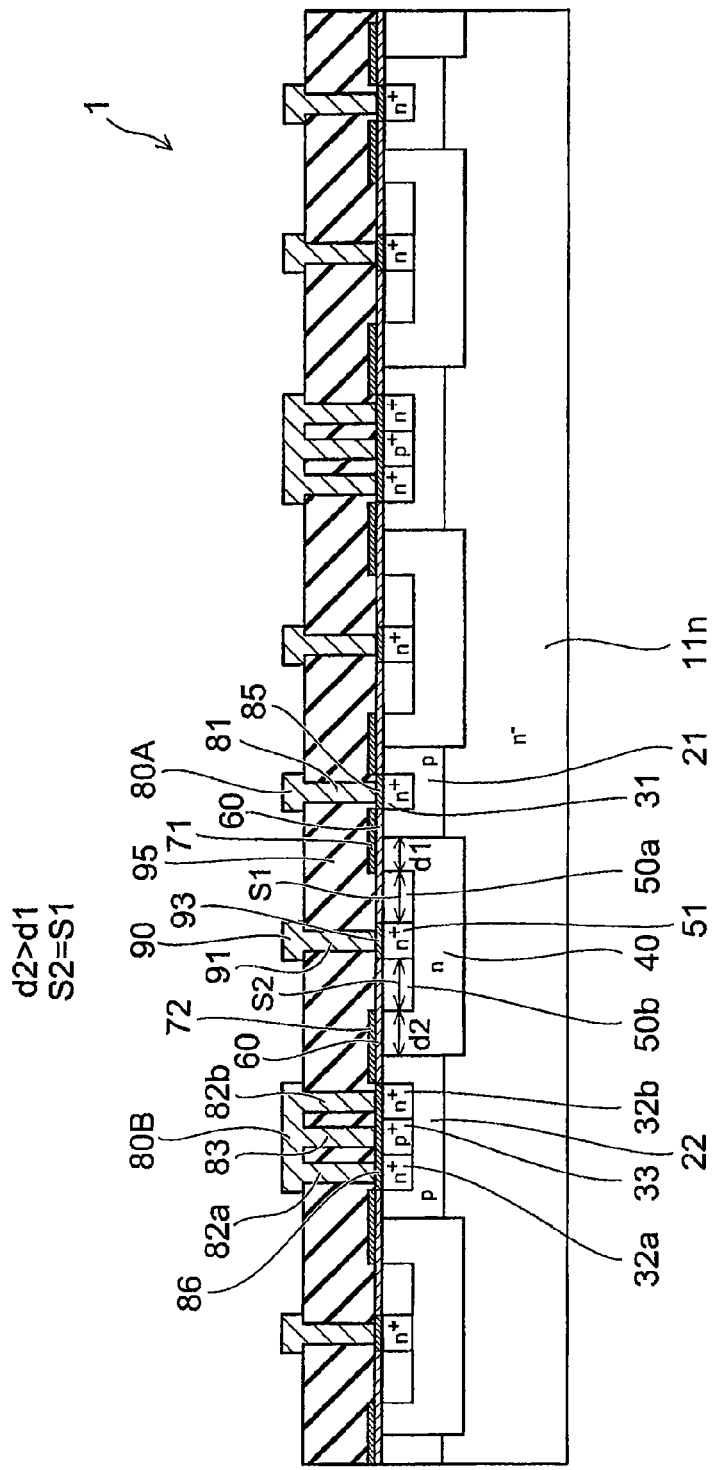
FIG. 1 is a cross-sectional view of a relevant part of a semiconductor device according to a first embodiment.

In general, according to one embodiment, a semiconductor device includes a semiconductor layer, a first base region of a first conductivity type, a first source region of a second conductivity type, a second base region of the first conductivity type, a back gate region of the first conductivity type, a drift region of the second conductivity type, a drain region of the second conductivity type, a first insulating region, a second insulating region, a first gate oxide film, a second gate oxide film, a first gate electrode, a second gate electrode, a first main electrode and a second main electrode.

The first base region of a first conductivity type is selectively provided on a surface of the semiconductor layer.

The first source region of a second conductivity type is selectively provided on a surface of the first base region.

The second base region of the first conductivity type is selectively provided on the surface of the semiconductor layer spaced from the first base region.

The back gate region of the first conductivity type is provided on a surface of the second base region adjacent to a second source region of a second conductivity type.

The drift region of the second conductivity type is sandwiched between the first base region and the second base region and selectively provided on the surface of the semiconductor layer.

The drain region of the second conductivity type is selectively provided on a surface of the drift region.

The first insulating region is provided to an interior from the surface of the drift region and faces the first base region via a portion of the drift region disposed.

The second insulating region is provided to the interior from the surface of the drift region and faces the second base region via a portion of the drift region disposed, and the drain region is sandwiched between the first insulating region and the second insulating region.

The first gate oxide film is provided on the surface of the first base region.

The second gate oxide film is provided on the surface of the second base region.

The first gate electrode is provided on the first base region and the drift region via the first gate oxide film.

The second gate electrode is provided on the second base region and the drift region via the second gate oxide film.

The first main electrode is connected to the first source region, the second source region, and the back gate region.

The second main electrode is connected to the drain region.

The distance between the first base region and the first insulating region is not more than 1.8 μm, and the first base region faces the first insulating region via a portion of the drift region.

The distance between the first base region and the first insulating region is shorter than a distance between the second base region and the second insulating region, the first base region faces the first insulating region via a portion of the drift region, and the second base region faces the second insulating region via a portion of the drift region.

Various embodiments will be described hereinafter with reference to the accompanying drawings.

(First Embodiment)

FIG. 1 is a cross-sectional view of a relevant part of a semiconductor device according to a first embodiment.

Figure 2:
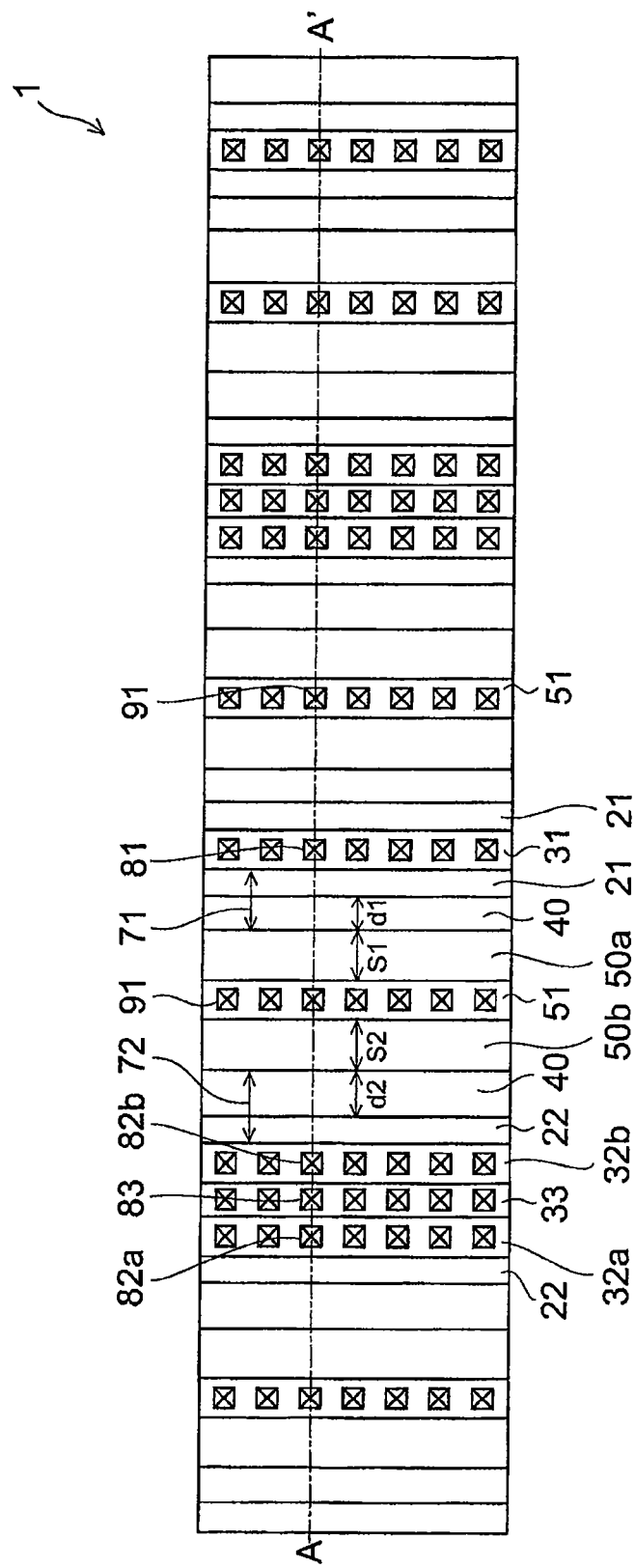
FIG. 2 is a plan view of the relevant part of the semiconductor device according to the first embodiment.

FIG. 2 is a plan view of the relevant part of the semiconductor device according to the first embodiment.

In FIG. 1, the cross-section at A-A' in FIG. 2 is illustrated. For convenience of explaining the construction of the lower side of a gate oxide film 60 of the semiconductor device 1, source electrodes 80A, 80B, a drain electrode 90, and an inter-layer insulating film 95 illustrated in FIG. 1 are not illustrated in FIG. 2. The semiconductor device 1 is used as an element of a power device (synchronous rectifying circuit device, or the like), for example. For the conductivity types of semiconductors, for example, p-type is the first conductivity type, and n-type is the second conductivity type.

The semiconductor device 1 illustrated in FIG. 1 is a lateral DMOS and includes a semiconductor layer 11n of the second conductivity type, and includes a first base region 21 of the first conductivity type selectively provided on a surface of the semiconductor layer 11n; a first source region 31 of the second conductivity type selectively provided on a surface of the first base region 21; a second base region 22 of the first conductivity type selectively provided on the surface of the semiconductor layer 11n and separated from the first base region 21; a back gate region of the first conductivity type provided on a surface of the second base region adjacent to a second source region 32a (or a source region 32b) and second source region 32a. "Adjacent to" includes both cases where the back gate region is disposed near to the source region, and cases where the back gate region is disposed adjoining the source region. This also applies to the positional relationship between other members.

In the semiconductor device 1, the semiconductor layer 11n may be replaced by an n⁻-type well region. Implant regions (not illustrated on the drawings) in which impurities are adjusted to predetermined concentrations may be provided on the surface of the base regions 21, 22, in order to adjust the DMOS threshold voltage (Vth). The base regions 21, 22 may also be referred to as p-type body regions or p-type well regions.

The semiconductor device 1 includes a drift region 40 of the second conductivity type selectively provided on the surface of the semiconductor layer 11n sandwiched between the first base region 21 and the second base region 22; a drain region 51 of the second conductivity type selectively provided on a surface of the drift region 40; a first insulating layer (Insulating region) 50a provided to the interior from the surface of the drift region 40, and that is in opposition to the first base region 21 via a portion of the drift region 40 disposed therebetween; and a second insulating layer (insulating region) 50b provided to the interior from the surface of the drift region 40 so as to together with the first insulating layer 50a sandwich the drain region 51, and that is in opposition to the second base region 22 via a portion of the drift region 40 disposed therebetween. The n⁺-type drain region 51 is provided on the surface of the semiconductor layer 11n separated from the base regions 21, 22. Also, the first insulating layer 50a, which is an STI region, and the second insulating layer 50b, which is likewise an STI region, is provided to the interior from the surface of the drift region 40.

The semiconductor device 1 includes gate oxide films 60 provided on the surface of the first base region 21, the surface of the second base region 22, and the surface of the drift region 40. The gate oxide film 60 provided on the surface of the first base region 21 is the first gate oxide film, and the gate oxide film 60 provided on the surface of the second base region 22 is the second gate oxide film. The semiconductor device 1 includes a first gate electrode 71 provided on the first base region 21 and the drift region 40 via the gate oxide film 60 disposed therebetween, and a second gate electrode 72 provided on the second base region 22 and the drift region 40 via the gate oxide film 60 disposed therebetween.

The semiconductor device 1 includes the source electrode 80A connected to the first source region 31; the source electrode 80B connected to the first source region 31, the second source region 32a (or, source region 32b), and the back gate region 33; and the drain electrode 90 connected to the drain region 51. Both the source electrode 80A and the source electrode 80B are common source electrodes, and both the source electrode 80A and the source electrode 80B together form the first main electrode of the semiconductor device 1. The drain electrode 90 forms the second main electrode of the semiconductor device 1.

The source region 31 is connected to the source electrode 80A via a source contact region 81. The source region 32a is connected to the source electrode 80B via a source contact region 82a. The source region 32b is connected to the source electrode 80B via a source contact region 82b. The back gate region 33 is connected to the source electrode 80B via a back gate contact region 83. The drain region 51 is connected to the drain electrode 90 via a drain contact region 91.

In the semiconductor device 1, a contact region 85 may be interposed between the source contact region 81 and the source region 31. Also, in the semiconductor device 1, a contact region 86 may be interposed between the source contact region 82a and the source region 32a, and between the source contact region 82b and the source region 32b, and between the back gate contact region 83 and the back gate region 33. Also, in the semiconductor device 1, a contact region 93 may be interposed between the drain contact region 91 and the drain region 51. If necessary, the contact regions 85, 86, and 93 may be omitted.

In the embodiment, the length of the gate electrodes 71, 72 in the direction from the source electrodes 80A, 80B to the drain electrode 90 respectively, is referred to as the gate length. The length of the gate in the direction generally normal to the gate length is referred to as the gate width. The gate length of the semiconductor device 1 is, for example, not more than 10 μm.

Also, within a plane of the semiconductor device 1 illustrated in FIG. 2, the first source region 31 and the second source region 32a (or the source region 32b) extend in a linear form. In addition, the back gate region 33 having a conductivity type that is different from that of the source regions 32a, 32b is provided between the source region 32a and the source region 32b. The back gate region 33 is disposed generally parallel to the source region 32a (or the source region 32b).

Also, within the plane of the semiconductor device 1, the drain region 51 is provided in opposition to the source region 31 and the source region 32a (or the source region 32b). The drain region 51 extends in linear form generally parallel to the source region 31 and the source region 32a (or the source region 32b). The construction in which the drain region 51 is provided between the first source region 31 and the second source region 32a (or the source region 32b) is disposed repeatedly within the plane of the semiconductor device 1.

In the semiconductor device 1, in order to suppress the increase in element area, a back gate region is not disposed at the first source region 31. In other words, in the source regions that sandwich the drain region 51, the back gate region 33 is adjacent to the source regions 32a, 32b, and a back gate region is not adjacent to the other source region 31. A back gate region is not adjacent to the source region 31, so it is possible to design the element length A between the source region 31 and the drain region 51 short.

In the embodiment, the distance between the opposing first base region 21 and the first insulating layer 50a via a portion of the drift region 40 disposed therebetween is d1. The distance between the opposing second base region 22 and the second insulating layer 50b via a portion of the drift region 40 disposed therebetween is d2. The distance d1 is a length of a portion of the drift region 40 sandwiched by the base region 21 and the insulating layer 50a. The distance d2 is a length of a portion of the drift region 40 sandwiched by the base region 22 and the insulating layer 50b. Then, for a reason that is explained later, the distances d1 and d2 are designed so that the distance d1 is shorter than the distance d2 (d2>d1). In the semiconductor device 1, the width S1 of the insulating layer 50a and the width S2 of the insulating layer 50b in the direction from the base region 21 to the base region 22 are approximately equal.

Also, on the top side of the gate electrodes 71, 72, the inter-layer insulating film 95 is provided on the top side of the gate oxide films 60 that protrude from the gate electrodes 71, 72. The source electrodes 80A, 80B and the drain electrode 90 protrude from the inter-layer insulating film 95.

In the semiconductor device 1, each source region 31, 32a, 32b is connected in parallel by common source electrodes, and each drain region 51 is connected in parallel by common drain electrodes. Furthermore, a pair of the source region 32a (or the source region 32b) and the drain region 51 is disposed on one side of the source region 31 and one other pair of the source region 32a (or the source region 32b) and the drain region 51 is disposed on one other side of the source region 31, when viewed in a direction normal to a major surface of the semiconductor layer.

Next, the operation effect of the semiconductor device 1 is explained.

The voltage difference between the source region 31 and the gate electrode 71 of the semiconductor device 1 is made to be lower than the threshold value (for example, 0 V), and a voltage (reverse bias voltage) that is positive with respect to the source region 31 is applied to the drain region 51. Then, a depletion layer extends from a junction portion (pn junction interface) between the base region 21 below the gate electrode 71 and the drift region 40 towards the base region 21 side and the drift region 40 side. At the same time, the voltage difference between the source region 32a, 32b and the gate electrode 72 of the semiconductor device 1 is made to be lower than the threshold value (for example, 0 V), and a voltage (reverse bias voltage) that is positive with respect to the source region 32a, 32b is applied to the drain region 51. Then, a depletion layer extends from the junction portion (pn junction interface) between the base region 22 below the gate electrode 72 and the drift region 40 towards the base region 22 side and the drift region 40 side.

In the semiconductor device 1, the impurity concentration (dose amount) in the drift region 40 is adjusted so that when the reverse bias voltages described above are applied, the portion of the drift region 40 sandwiched between the base region 21 and the insulating layer 50a (the portion with length d1) and the portion of the drift region 40 sandwiched between the base region 22 and the insulating layer 50b (the portion with length d2) become completely depleted. The depletion layers after becoming completely depleted can be approximated as dielectric layers.

Therefore, the reverse bias voltage applied to the source region 31 and the drain region 51 is shared by the insulating layer 50a and the depletion layer produced in the portion (the portion with length d1) of the drift region 40 sandwiched between the base region 21 and the insulating layer 50a. Also, the reverse bias voltage applied to the source regions 32a, 32b and the drain region 51 is shared by the insulating layer 50b and the depletion layer produced in the portion (the portion with length d2) of the drift region 40 sandwiched between the base region 22 and the insulating layer 50b.

At this time, a proportion of the reverse bias voltage borne by the insulating layer is higher the shorter the distance d between the opposing base region and insulating layer. In other words, if the depletion layer is adjacent to the insulating layer, the shorter the distance d between the opposing base region and the insulating layer, the greater the proportion of the voltage applied to the insulating layer. Here, the breakdown voltage of an insulating layer is higher than that of a semiconductor layer.

In the semiconductor device 1, the source to drain breakdown voltage (BVdss) between the source region 31 and the drain region 51 is increased not by increasing the length d1 of the portion of the drift region 40 sandwiched between the base region 21 and the insulating layer 50a to increase the breakdown voltage, but by making the distance d1 between the opposing base region 21 and the insulating layer 50a shorter than the distance d2, with the distance of the portion of the drift region 40 sandwiched between the base region 21 and the insulating layer 50a being completely depleted.

Figure 3A:
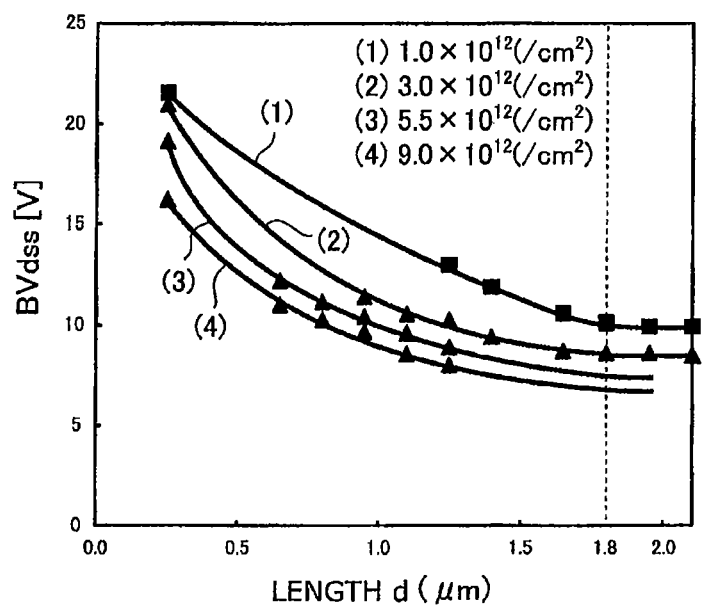
FIGS. 3A and 3B illustrate the relationship between the source to drain breakdown voltage (BVdss) and the length of the portion of the drift region sandwiched between the base region and the insulating layer.
Figure 3B:
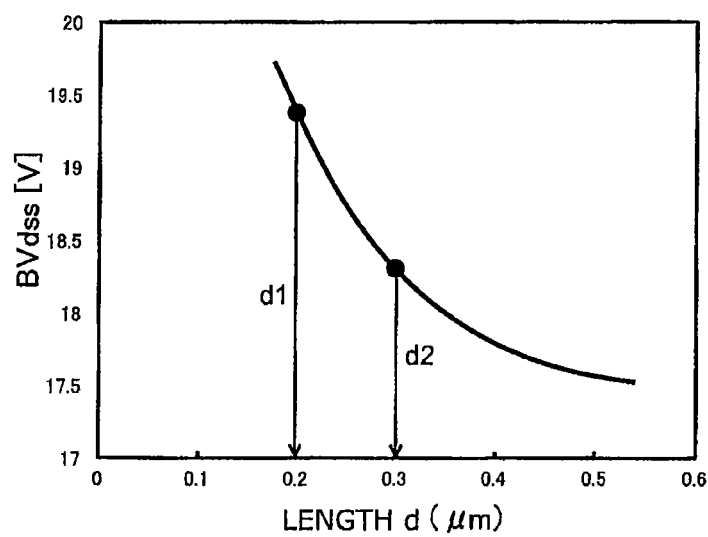

FIGS. 3A and 3B illustrate the relationship between the source to drain breakdown voltage (BVdss) and the length of the portion of the drift region sandwiched between the base region and the insulating layer. These results were obtained by the inventors by experimental simulation.

The horizontal axes of FIGS. 3A and 3B are the distance d (d1, d2) of the portion of the drift region 40 sandwiched between the base region and the insulating layer, and the vertical axes are the source to drain breakdown voltage (BVdss).

FIG. 3A shows the simulation results for the relationship between the distance d and BVdss for the cases where the impurity dose amounts in the drift region 40 were (1): $1.0 \times 10^{12}(/cm^2)$, (2): $3.0 \times 10^{12}(/cm^2)$, (3): $5.5 \times 10^{12}(/cm^2)$, and (4): $9.0 \times 10^{12}(/cm^2)$.

According to the results of FIG. 3A, it can be seen that in regions where the length is not more than 1.8 μm, the shorter the length d (d1, d2) the greater is BVdss, regardless of the impurity dose amount of the drift region 40. The cases for d1=0.2 μm and d2=0.3 μm are illustrated as examples. This is because in the region where the length is not more than 1.8 μm, as a result of complete depletion of the portion of the drift region 40 sandwiched between the base region and the insulating layer, a proportion of the applied reverse bias voltage is shared between the depletion layer (dielectric layer) and the insulating layer, so the shorter the distance d the greater the proportion of the reverse bias voltage taken by the insulating layer. As a result, it is considered that BVdss increases. In the semiconductor device 1, of the lengths d1 and the length d2, at least the length d1 is set to not more than 1.8 μm. In order to further reduce the element area, preferably both the length d1 and the length d2 are not more than 1.8 μm.

Conventionally the length d of the portion of the drift region 40 sandwiched between the base region and the insulating layer is increased as a measure of increasing BVdss. This uses the effect of increasing BVdss by increasing the length d of the portion of the drift region 40 sandwiched between the base region and the insulating layer, so that the gradient of the voltage in the portion of the drift region 40 sandwiched between the base region and the insulating layer is reduced. However, this method has the problem that it inevitably increases the element area by the amount that the length d is increased.

In contrast, in the semiconductor device 1, as illustrated in FIG. 3B, making the length d1 of the portion of the drift region 40 sandwiched between the base region 21 and the insulating layer 50a shorter than the length d2 of the portion of the drift region 40 sandwiched between the base region 22 and the Insulating layer 50b (d2>d1), increases the source to drain breakdown voltage (BVdss) between the source region 31 and the drain region 51.

As a result, for the semiconductor device 1, BVdss between the source region 31 and the drain region 51 is higher than BVdss between the source region 32a (or the source region 32b) and the drain region 51, without increasing the element area in order to improve the breakdown voltage.

The width S1 of the insulating layer 50a and the width S2 of the insulating layer 50b in the direction from the base region 21 to the base region 22 are approximately equal. As an example, S1=S2=0.5 μm. However, S1 and S2 are not limited to this value.

According to the semiconductor device 1, the element area is not increased compared with the conventional construction (on the contrary, it is reduced), and it is possible to make the avalanche durability between the drain region 51 and the source region 31, which is not adjacent to a back gate region, higher than the avalanche durability between the drain region 51 and the source regions 32a, 32b, which are adjacent to the back gate region 33. In other words, it is difficult for element failure (avalanche breakdown) to occur between the source region 31 and the drain region 51 before it occurs between the source regions 32a, 32b and the drain region 51. In other words, by reducing the avalanche durability between the source regions 32a, 32b and the drain region 51 compared with the avalanche durability between the source region 31 and the drain region 51, avalanche breakdown can more easily occur between the source regions 32a, 32b and the drain region 51 before it occurs between the source region 31 and the drain region 51.

On the other hand, even though avalanche breakdown can occur more easily between the source regions 32a, 32b and the drain region 51 than between the source region 31 and the drain region 51, the back gate region 33 is adjacent to the source regions 32a, 32b.

Therefore, even though avalanche breakdown occurs between the source regions 32a, 32b and the drain region 51 before avalanche breakdown occurs between the source region 31 and the drain region 51, carriers (for example, holes) that are generated between the source regions 32a, 32b and the drain region 51 are efficiently discharged from the back gate region 33 to the source electrode 80B. Therefore, the margin against avalanche durability between the source regions 32a, 32b and the drain region 51 is increased, and as a result there is high avalanche durability. In other words, the resistance to breakdown between the source region 31 and the drain region 51, and the resistance to breakdown between the source regions 32a, 32b and the drain region 51 are both increased. Therefore, the overall avalanche durability of the semiconductor device 1 is improved.

Also, avalanche breakdown is made to occur more easily between the source regions 32a, 32b and the drain region 51 than between the source region 31 and the drift region 51, so the source to drain breakdown voltage of the semiconductor device 1 can be controlled by the resistance to breakdown between the between the source regions 32a, 32b and the drain region 51.

Then, when a voltage difference higher than the threshold value is applied between the source region 31 and the gate electrode 71 of the semiconductor device 1, and a voltage difference higher than the threshold value is applied between the source regions 32a, 32b and the gate electrode 72, channels are formed on a surfaces of the source regions 21, 22, and a current flows between the source and drain.

As a result of this type of action, the semiconductor device 1 operates.

Next a variation of the embodiment is explained. In the following explanation, the same position and reference numeral is applied to the same member, and for members that have been explained once, the explanation of the result of the action of the member is omitted as necessary. The modified portions of the embodiment are explained in detail.

(Second Embodiment)

Figure 4:
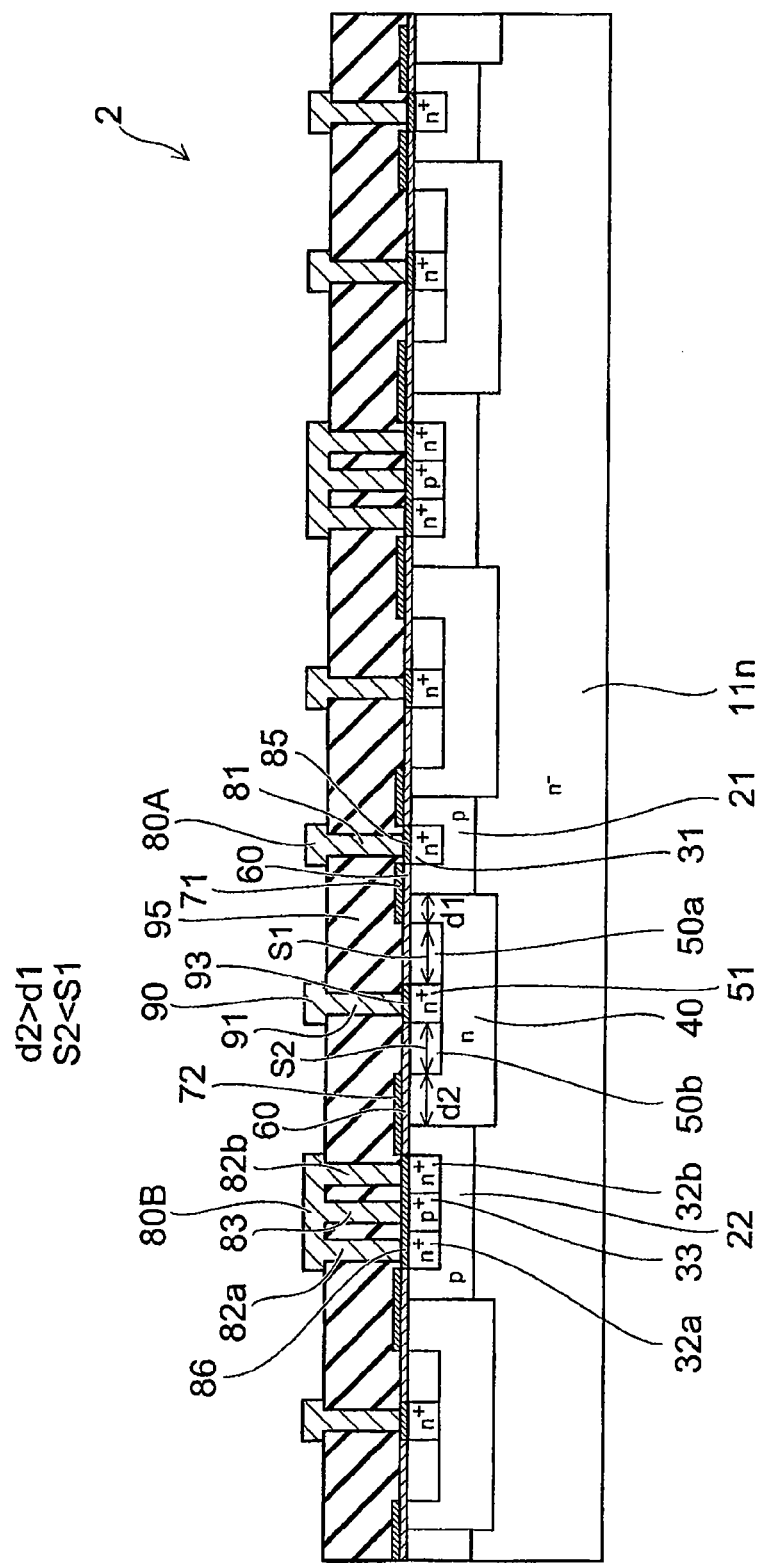
FIG. 4 is a cross-sectional view of a relevant part of a semiconductor device according to a second embodiment.

FIG. 4 is a cross-sectional view of a relevant part of a semiconductor device according to a second embodiment.

A basic construction of a semiconductor device 2 is the same as the basic construction of the semiconductor device 1. In the semiconductor device 2, the distance d1 between the opposing base region 21 and the insulating layer 50a, which is the length (not more than 1.8 μm) of the portion of the drift region 40 sandwiched between the base region 21 and insulating layer 50a that can be completely depleted, is shorter than the distance d2 between the opposing base region 22 and the insulating layer 50b (d2>d1).

In addition, in the semiconductor device 2, the width S1 of the insulating layer 50a is greater than the width S2 of the insulating layer 50b in the direction from the base region 21 to the base region 22. In other words, the length of the insulating layer 50a between the drift region 40 that is adjacent to the base region 21 and the drain region 51 (the width S1) is longer than the length of the insulating layer 50b between the drift region 40 that is adjacent to the base region 22 and the drain region 51 (the width S2)

In the semiconductor device 2, as an example, d1=0.2 μm, d2=0.3 μm, S1=0.6 μm, and S2=0.5 μm. However, d1, d2, S1, and S2 are not limited to the above values.

In the semiconductor device 2, when the reverse bias voltages described above are applied, the portion of the drift region 40 sandwiched between the base region 21 and the insulating layer 50a (the portion with length d1) and the portion of the drift region 40 sandwiched between the base region 22 and the insulating layer 50b (the portion with length d2) become completely depleted.

The reverse bias voltage applied to the source region 31 and the drain region 51 is shared by the insulating layer 50a and the depletion layer produced in the portion (the portion with length d1) of the drift region 40 sandwiched between the base region 21 and the insulating layer 50a. Also, the reverse bias voltage applied to the source regions 32a, 32b and the drain region 51 is shared by the insulating layer 50b and the depletion layer produced in the portion (the portion with length d2) of the drift region 40 sandwiched between the base region 22 and the insulating layer 50b.

In the semiconductor device 2, in addition to the distance d2 being greater than the distance d1, the width S1 of the insulating layer 50a is longer than the width S2 of the insulating layer 50b, so it is possible to increase the proportion of the reverse bias voltage borne by the insulating layer 50a higher than the proportion of the reverse bias voltage borne by the insulating layer 50b, even more than in the semiconductor device 1 according to the first embodiment. Here, the breakdown voltage of the insulating layer is higher than that of a semiconductor layer.

Therefore, BVdss between the source region 31 and the drain region 51 is higher than BVdss between the source region 32a (or the source region 32b) and the drain region 51.

According to the semiconductor device 2, the avalanche durability between the drain region 51 and the source region 31, which is not adjacent to a back gate region, is higher than the avalanche durability between the drain region 51 and the source regions 32a, 32b, which are adjacent to the back gate region 33. In other words, it is more difficult for element failure (avalanche breakdown) to occur between the source region 31 and the drain region 51 before it occurs between the source regions 32a, 32b and the drain region 51. In other words, by reducing the avalanche durability between the source regions 32a, 32b and the drain region 51 lower than the avalanche durability between the source region 31 and the drain region 51, avalanche breakdown can more easily occur between the source regions 32a, 32b and the drain region 51 before it occurs between the source region 31 and the drain region 51.

On the other hand, even though avalanche breakdown can occur more easily between the source regions 32a, 32b and the drain region 51 than between the source region 31 and the drain region 51, the back gate region 33 is adjacent to the source regions 32a, 32b.

Therefore, even though avalanche breakdown occurs between the source regions 32a, 32b and the drain region 51 before avalanche breakdown occurs between the source region 31 and the drain region 51, carriers (for example, holes) that are generated between the source regions 32a, 32b and the drain region 51 are efficiently discharged from the back gate region 33 to the source electrode 80B. Therefore, the margin against avalanche durability between the source regions 32a, 32b and the drain region 51 is increased, and as a result there is high avalanche durability. In other words, the resistance to breakdown between the source region 31 and the drain region 51, and the resistance to breakdown between the source regions 32a, 32b and the drain region 51 are both increased.

Also, avalanche breakdown is made to occur more easily between the source regions 32a, 32b and the drain region 51 than between the source region 31 and the drift region 51, so the source to drain breakdown voltage of the semiconductor device 2 can be controlled by the resistance to breakdown between the source regions 32a, 32b and the drain region 51.

According to this construction, it is possible to make the element area smaller compared with the conventional construction, and avalanche breakdown can occur more easily between the source regions 32a, 32b and the drain region 51 than between the source region 31 and the drain region 51. Therefore, the overall avalanche durability of the semiconductor device 2 is improved.

In the drawings, an example in which d2>d1 and S2<S1 is illustrated, but a form in which the length d1 and the length d2 are equal provided they are lengths that can ensure complete depletion (for example, d1=d2=0.2 µm) and S1=0.6 µm and S2=0.5 µm may be considered as the semiconductor device 2. In the semiconductor device 2 with these dimensions, it is possible to suppress the increase in the element area compared with the conventional construction. However, d1, d2, S1, and S2 are not limited to the above values.

(Third Embodiment)

Figure 5:
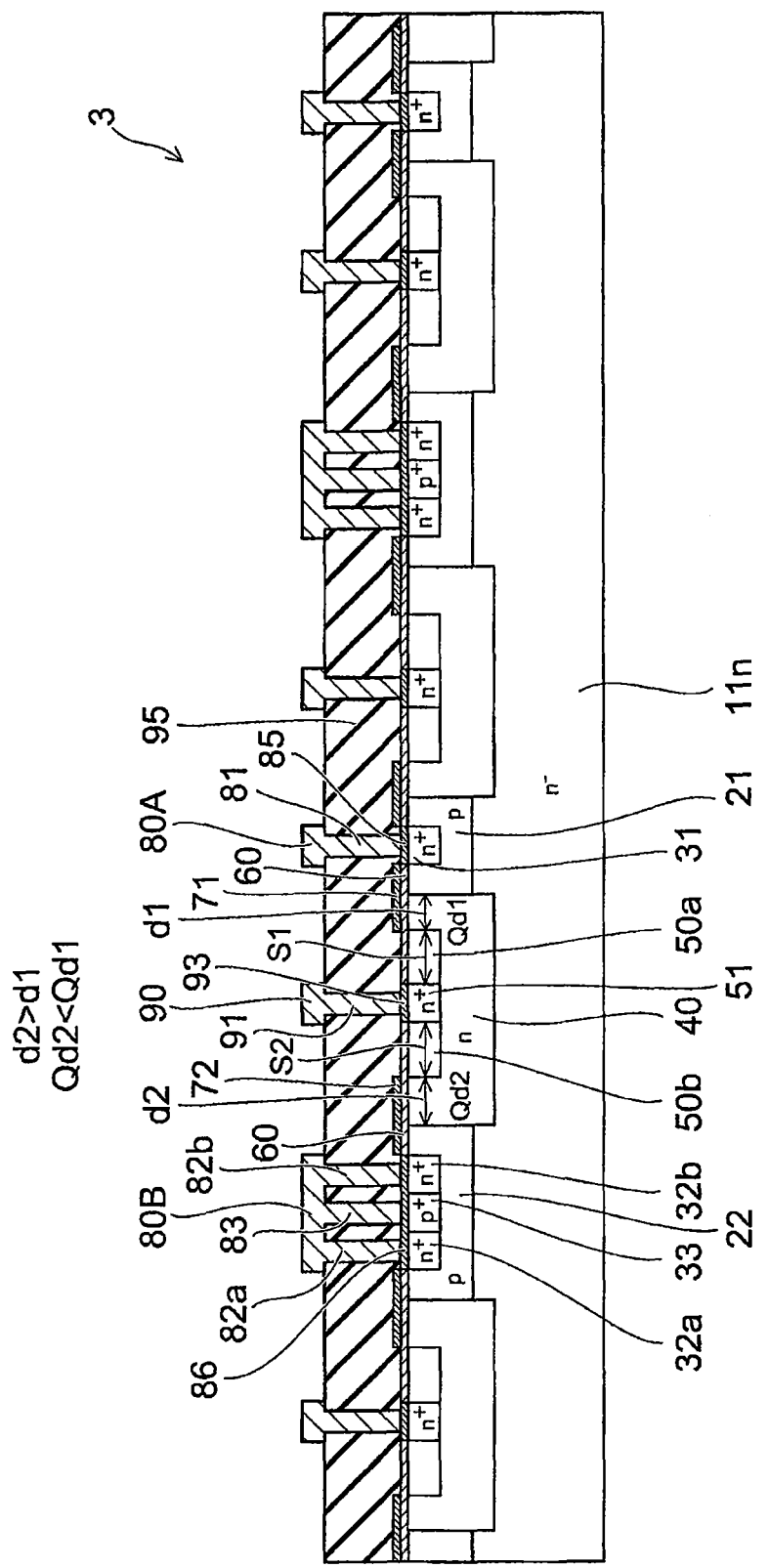
FIG. 5 is a cross-sectional view of a relevant part of a semiconductor device according to a third embodiment.

FIG. 5 is a cross-sectional view of a relevant part of a semiconductor device according to a third embodiment.

A basic construction of a semiconductor device 3 is the same as the basic construction of the semiconductor device 1. In the semiconductor device 3, the distance d1 between the opposing base region 21 and the insulating region 50a, which is the length (not more than 1.8 µm) of the portion of the drift region 40 sandwiched between the base region 21 and insulating layer 50a that can be completely depleted, is shorter than the distance d2 between the opposing base region 22 and the insulating layer 50b (d2>d1).

In addition, in the semiconductor device 3, the impurity concentration Qd1 (first Impurity concentration) of the portion of the drift region 40 sandwiched between the base region 21 and the insulating layer 50a, which is a portion of the drift region 40, is designed to be different from the impurity concentration Qd2 (second impurity concentration) of the portion of the drift region 40 sandwiched between the base region 22 and the insulating layer 50b, which is another portion of the drift region 40. For example, in the drawings, an example in which Qd2<Qd1 is illustrated, but for a reason explained later, Qd2 may also be greater than Qd1.

Here, the impurity concentration Qd1 is the concentration so that when the reverse bias voltage as described above is applied, the portion of the drift region 40 sandwiched between the base region 21 and the insulating layer 50a (the portion with length d1) becomes completely depleted. The impurity concentration Qd2 is the concentration so that when the reverse bias voltage as described above is applied, the portion of the drift region 40 sandwiched between the base region 22 and the insulating layer 50b (the portion with length d2) becomes completely depleted.

In the semiconductor device 3, the reason for varying the values of Qd1 and Qd2 is explained as follows.

Figure 6A:
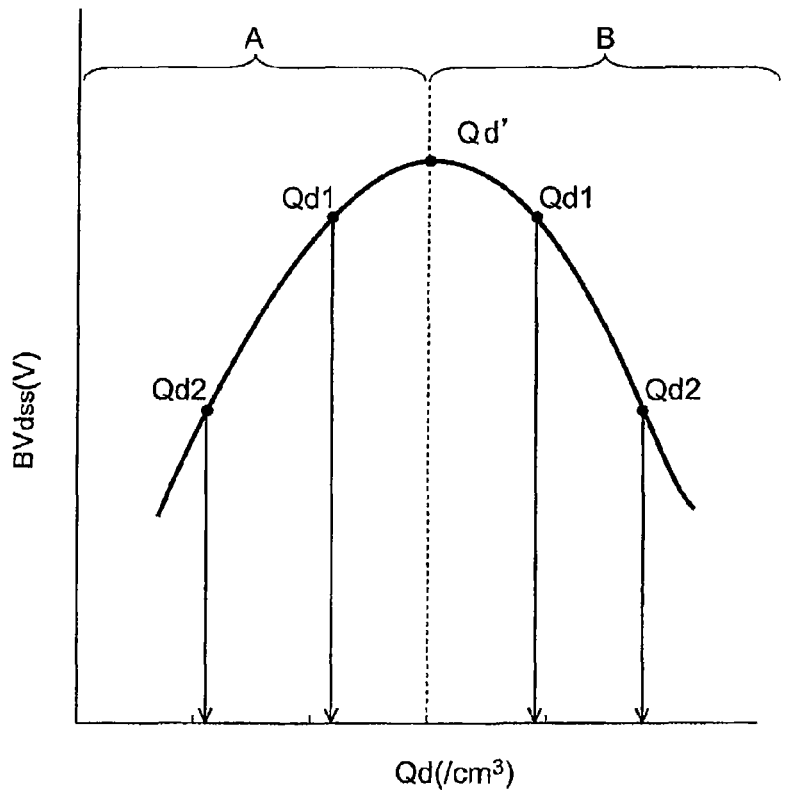
FIGS. 6A and 6B illustrate the relationship between the source to drain breakdown voltage (BVdss) and the impurity concentration of the portion of the drift region sandwiched between the base region and the insulating layer.
Figure 6B:
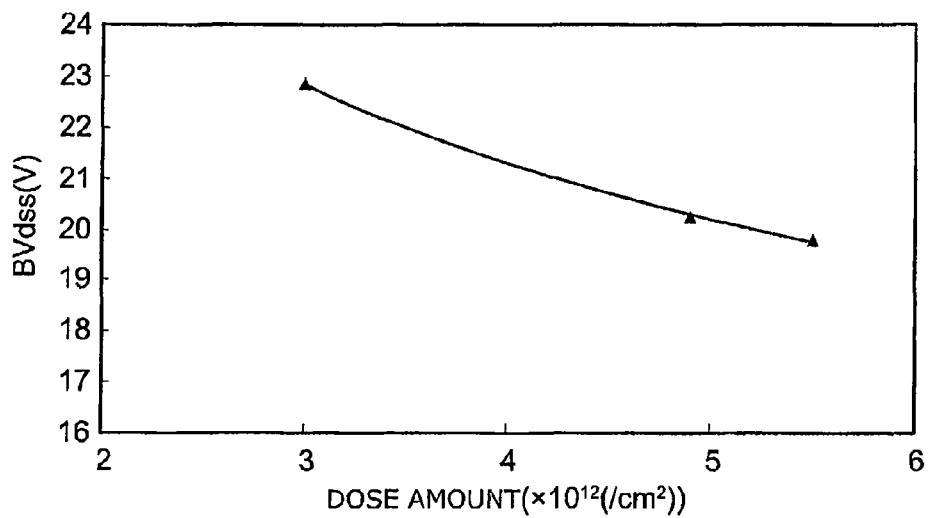

FIGS. 6A and 6B illustrate the relationship between the source to drain breakdown voltage (BVdss) and the impurity concentration of the portion of the drift region sandwiched between the base region and the insulating layer.

The horizontal axis in FIG. 6A is the impurity concentration Qd (/cm$^3$) of the portion of the drift region 40 sandwiched between the base region and the insulating layer, and the horizontal axis in FIG. 6B is the impurity dose amount (/cm$^2$), and the vertical axes in FIGS. 6A and 6B is the source to drain breakdown voltage (BVdss). && The impurity concentration Qd is adjusted to the target value by, for example, adjusting as appropriate the ion implantation dose amount and activation conditions, and so on. In FIG. 6A, the impurity concentration Qd that gives the highest source to drain breakdown voltage (BVdss) is denoted by Qd', and the left side of Qd' is denoted as a region A, and the right side of Qd' is denoted as region B.

For the region A, an example is explained for the case that the reverse bias is applied between the source region 31 and the drain region 51.

When the voltage difference between the source region 31 and the gate electrode 71 of the semiconductor device 3 is made to be lower than the threshold value (for example, 0V), and a voltage (reverse bias voltage) that is positive with respect to the source region 31 is applied to the drain region 51, a depletion layer extends from the junction portion (pn junction interface) between the base region 21 below the gate electrode 71 and the drift region 40 towards the base region 21 side and the drift region 40 side. The region A is the region where the depletion layer is completely depleted.

In the region A, the lower the impurity concentration Qd the easier the depletion layer spreads. For example, the lower the impurity concentration Qd the easier it is for the tip of the depletion layer to extend from the pn junction interface towards the base region 21 side and reach the source region 31. Also, the lower the impurity concentration Qd the easier it is for the tip of the depletion layer to extend from the pn junction interface towards the drift region 40 side and reach the drain region 51. Therefore, in the region A, the lower the impurity concentration Qd, the easier it is for the source region 31 and the drain region 51 to be connected in a continuous depletion layer. In other words, in the region A, the lower the impurity concentration Qd, the easier it is for punch through to occur between source and drain. In this way, in the region A, the lower the impurity concentration Qd, the lower the breakdown voltage of the semiconductor device 3.

However, in the region A, as the impurity concentration Qd increases, the spread of depletion layers is suppressed. Here, preferably the tip of the depletion layer that extends from the junction portion of the base region 21 and the drift region 40 towards the base region 21 side does not reach the source region 31, but stops before reaching the source region 31. Also, preferably the tip of the depletion layer that extends from the junction portion of the base region 21 and the drift region 40 towards the drift region 40 side does not reach the drain region 51, but stops before reaching the drain region 51. In this case the gradient of the voltage between the source and drain is most gentle, and the semiconductor device 3 maintains a high breakdown voltage. Therefore, in the region A, the higher the impurity concentration Qd, the greater the breakdown voltage of the semiconductor device 3.

On the other hand, in region B where the impurity concentration is higher than Qd', the impurity concentration is further increased, so it is more difficult for depletion layers to extend than in the region A. In this way, the gradient of the applied voltage between the source and drain forms a portion that is steeper than that in the region A. The gradient of the applied voltage becomes steeper the higher the impurity concentration. In other words, the higher the impurity concentration, the shorter the substantial element length, and the easier it is for avalanche breakdown to occur between the source and drain. As a result, the breakdown voltage of the semiconductor device 3 is reduced.

For example, FIG. 6B illustrates the relationship between the source to drain breakdown voltage (BVdss) and the dose amount of impurities in the portion of the drift region sandwiched between the base region and the insulating layer, in a region B. These results were obtained by the inventors by experimental simulation. As Illustrated in FIG. 6B, with the lower dose amount of impurities, the higher source to drain breakdown voltage (BVdss) can be obtained.

The same phenomenon can occur between the source regions 32a, 32b and the drain region 51.

In the semiconductor device 3, when the semiconductor device is designed in the region A illustrated in FIGS. 6A and 6B, the impurity concentration Qd1 of the portion of the drift region 40 sandwiched between the base region 21 and the insulating layer 50a is designed to be higher than the impurity concentration Qd2 of the portion of the drift region 40 sandwiched between the base region 22 and the insulating layer 50b. Also, when the semiconductor device is designed in the region B, the impurity concentration Qd1 of the portion of the drift region 40 sandwiched between the base region 21 and the insulating layer 50a is designed to be lower than the impurity concentration Qd2 of the portion of the drift region 40 sandwiched between the base region 22 and the insulating layer 50b.

Therefore, BVdss between the source region 31 and the drain region 51 is higher than BVdss between the source region 32a (or the source region 32b) and the drain region 51.

According to the semiconductor device 3, the avalanche durability between the drain region 51 and the source region 31, which is not adjacent to a back gate region, is higher than the avalanche durability between the drain region 51 and the source regions 32a, 32b, which are adjacent to the back gate region 33. In other words, it is more difficult for element failure (avalanche breakdown) to occur between the source region 31 and the drain region 51 before it occurs between the source regions 32a, 32b and the drain region 51. In other words, by reducing the avalanche durability between the source regions 32a, 32b and the drain region 51 lower than the avalanche durability between the source region 31 and the drain region 51, avalanche breakdown can more easily occur between the source regions 32a, 32b and the drain region 51 before it occurs between the source region 31 and the drain region 51.

On the other hand, even though avalanche breakdown can occur more easily between the source regions 32a, 32b and the drain region 51 than between the source region 31 and the drain region 51, the back gate region 33 is adjacent to the source regions 32a, 32b.

Therefore, even though avalanche breakdown occurs between the source regions 32a, 32b and the drain region 51 before avalanche breakdown occurs between the source region 31 and the drain region 51, carriers (for example, holes) that are generated between the source regions 32a, 32b and the drain region 51 are efficiently discharged from the back gate region 33 to the source electrode 80B. Therefore, the margin against avalanche breakdown between the source regions 32a, 32b and the drain region 51 is increased, and as a result there is high avalanche durability. In other words, the resistance to breakdown between the source region 31 and the drain region 51, and the resistance to breakdown between the source regions 32a, 32b and the drain region 51 are both increased.

Also, avalanche breakdown is made to more easily occur between the source regions 32a, 32b and the drain region 51 than between the source region 31 and the drain region 51, so the source to drain breakdown voltage of the semiconductor device 3 can be controlled by the resistance to breakdown between the source regions 32a, 32b and the drain region 51.

To further increase BVdss between the source region 31 and the drain region 51 higher than BVdss between the source region 32a (or the source region 32b) and the drain region 51, the width S1 of the insulating layer 50a may be made longer than the width S2 of the insulating layer 50b.

According to this construction, it is possible to make the element area smaller compared with the conventional construction, and avalanche breakdown can occur more easily between the source regions 32a, 32b and the drain region 51 than between the source region 31 and the drain region 51. Therefore, the overall avalanche durability of the semiconductor device 3 is improved.

(Fourth Embodiment)

Figure 7:
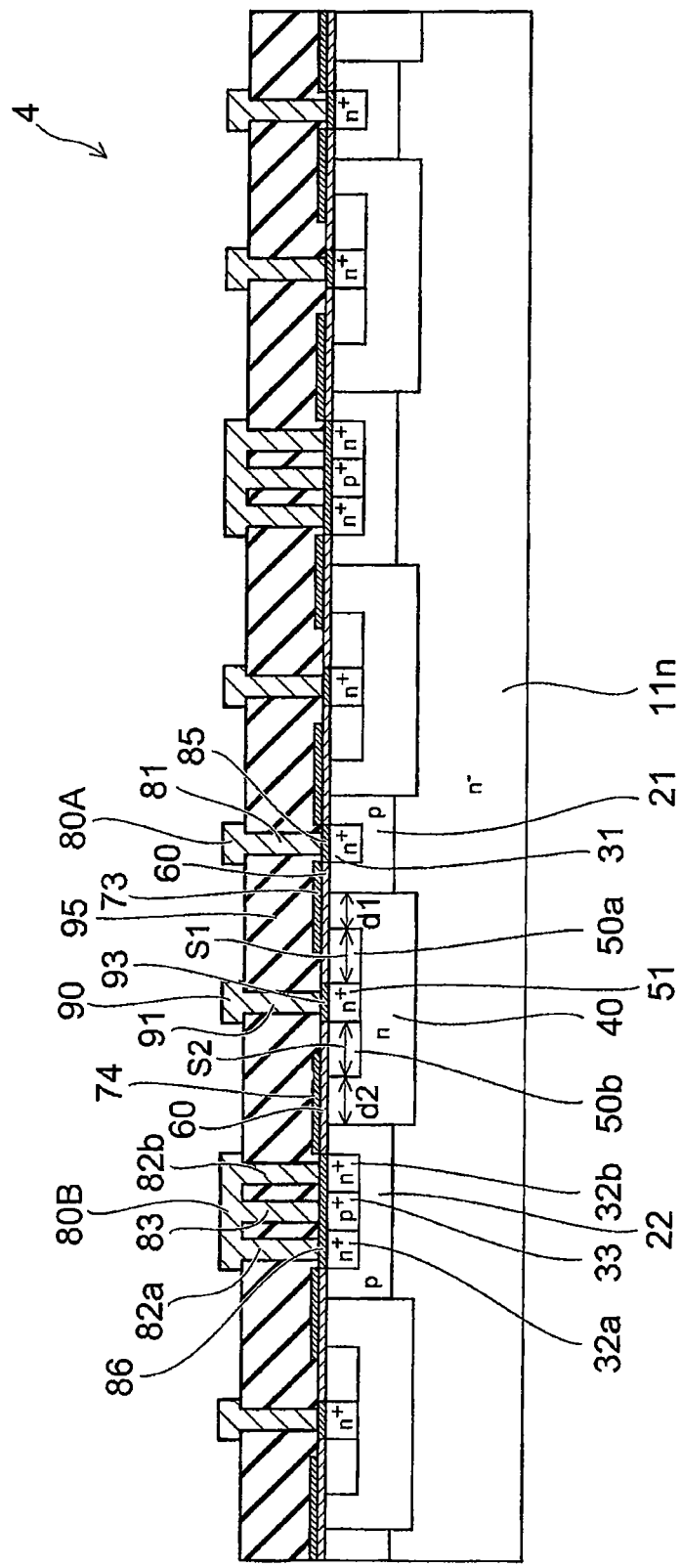
FIG. 7 is a cross-sectional view of a relevant part of a semiconductor device according to a fourth embodiment.

FIG. 7 is a cross-sectional view of a relevant part of a semiconductor device according to a fourth embodiment.

A basic construction of the semiconductor device 4 is the same as the basic construction of the semiconductor device 1. In the semiconductor device 4, the distance d1 between the opposing base region 21 and the insulating region 50a, which is the length (not more than 1.8 µm) of the portion of the drift region 40 sandwiched between the base region 21 and insulating layer 50a that can be completely depleted, is shorter than the distance d2 between the opposing base region 22 and the insulating layer 50b (d2>d1).

In addition, in the semiconductor device 4, a gate electrode 73 on the gate oxide film 60 extends to the insulating layer 50a in the direction from the base region 21 to the drain region 51. Or, in the semiconductor device 4, a gate electrode 74 on the gate oxide film 60 extends to the insulating layer 50b in the direction from the base region 22 to the drain region 51. The extended electrodes 73, 74 function as field plate electrodes. In order to prevent a short circuit between gate and drain, the gate electrode 73 and the gate electrode 74 do not extend to the top side of the drain region 51.

By extending the gate electrode 73 on the gate oxide film 60 to above the insulating layer 50a in the direction from the source region 21 to the drain region 51, the depletion layer can more easily spread within the drift region 40, and the concentration of the electric field at the tip of the base region 21 is reduced. Or, by extending the gate electrode 74 on the gate oxide film 60 to above the insulating layer 50b in the direction from the source region 22 to the drain region 51, the depletion layer can more easily spread within the drift region 40, and the concentration of the electric field at the tip of the base region 22 is reduced.

The above effect in which the gate electrodes function as field plate electrodes is promoted more at the gate electrode 73 side than the gate electrode 74 side. This adjustment is carried out by adjusting the lengths of the gate electrode 73 and the gate electrode 74.

According to the semiconductor device 4, the avalanche durability between the drain region 51 and the source region 31, which is not adjacent to a back gate region, is higher than the avalanche durability between the drain region 51 and the source regions 32a, 32b, which are adjacent to the back gate region 33. In other words, it is more difficult for element failure (avalanche breakdown) to occur between the source region 31 and the drain region 51 before it occurs between the source regions 32a, 32b and the drain region 51. In other words, by reducing the avalanche durability between the source regions 32a, 32b and the drain region 51 lower than the avalanche durability between the source region 31 and the drain region 51, avalanche breakdown can more easily occur between the source regions 32a, 32b and the drain region 51 before it occurs between the source region 31 and the drain region 51.

On the other hand, even though avalanche breakdown can occur more easily between the source regions 32a, 32b and the drain region 51 than between the source region 31 and the drain region 51, the back gate region 33 is adjacent to the source regions 32a, 32b.

Therefore, even though avalanche breakdown occurs between the source regions 32a, 32b and the drain region 51 before avalanche breakdown occurs between the source region 31 and the drain region 51, carriers (for example, holes) that are generated between the source regions 32a, 32b and the drain region 51 are efficiently discharged from the back gate region 33 to the source electrode 80B. Therefore, the margin against avalanche breakdown between the source regions 32a, 32b and the drain region 51 is increased, and as a result there is high avalanche durability. In other words, the resistance to breakdown between the source region 31 and the drain region 51, and the resistance to breakdown between the source regions 32a, 32b and the drain region 51 are both increased.

Also, avalanche breakdown is made to more easily occur between the source regions 32a, 32b and the drain region 51 than between the source region 31 and the drift region 51, so the source to drain breakdown voltage of the semiconductor device 4 can be controlled by the resistance to breakdown between the source regions 32a, 32b and the drain region 51.

To further increase BVdss between the source region 31 and the drain region 51 higher than BVdss between the source region 32a (or the source region 32b) and the drain region 51, the width S1 of the insulating layer 50a may be made longer than the width S2 of the insulating layer 50b.

Or, as in the semiconductor device 3, the impurity concentration Qd1 of the portion of the drift region 40 that is sandwiched between the base region 21 and the insulating layer 50a, and the impurity concentration Qd2 of the portion of the drift region 40 that is sandwiched between the base region 22 and the insulating layer 50b, may be designed to be different.

According to this construction, it is possible to make the element area smaller compared with the conventional construction, and avalanche breakdown can occur more easily between the source regions 32a, 32b and the drain region 51 than between the source region 31 and the drain region 51. Therefore, the overall avalanche durability of the semiconductor device 4 is improved.

(Fifth Embodiment)

Figure 8:
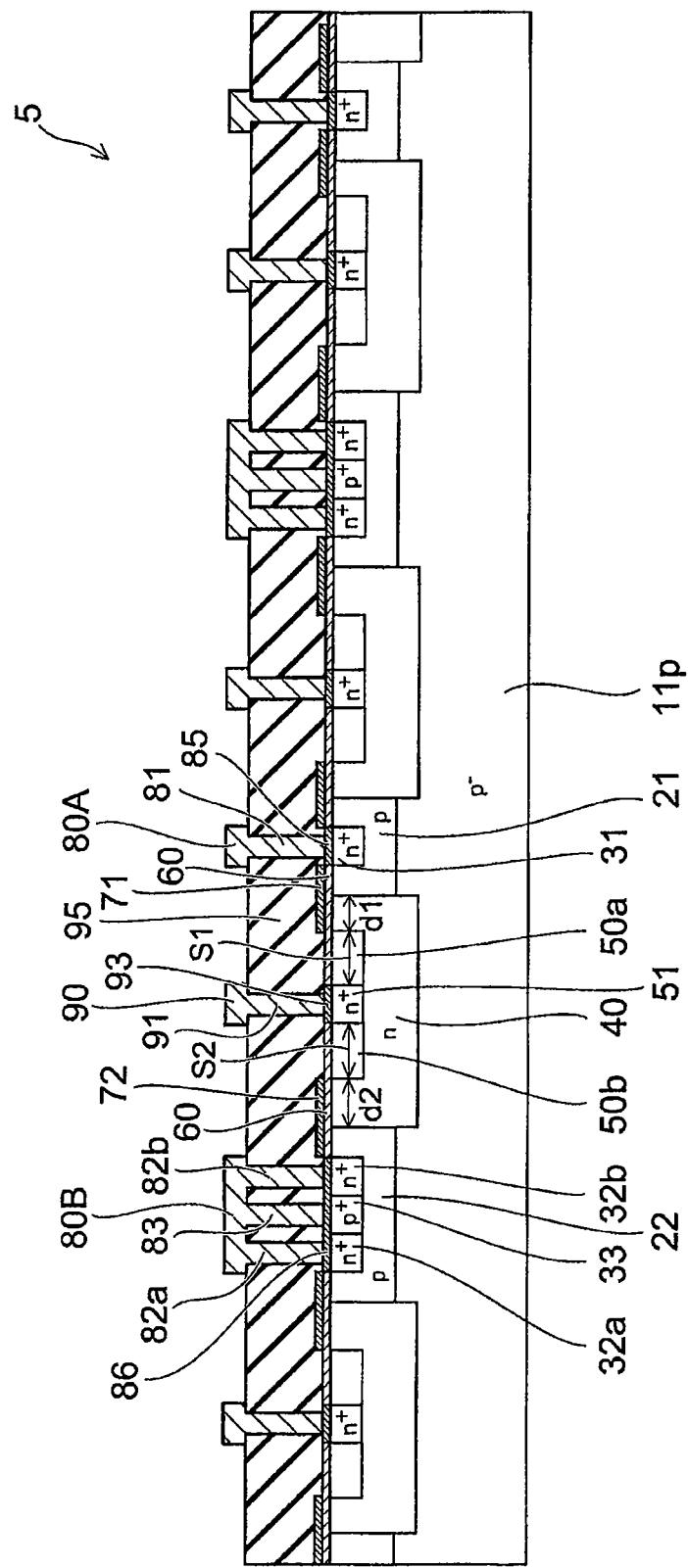
FIG. 8 is a cross-sectional view of a relevant part of a semiconductor device according to a fifth embodiment.

FIG. 8 is a cross-sectional view of a relevant part of a semiconductor device according to a fifth embodiment.

A basic construction of the semiconductor device 5 is the same as the basic construction of the semiconductor device 1. In the semiconductor device 5, the distance d1 between the opposing base region 21 and the insulating region 50a, which is the length (not more than 1.8 μm) of the portion of the drift region 40 sandwiched between the base region 21 and insulating layer 50a that can be completely depleted, is shorter than the distance d2 between the opposing base region 22 and the insulating layer 50b (d2>d1).

In addition, in the semiconductor device 5, instead of an n⁻-type semiconductor layer 11n, a p⁻-type semiconductor layer 11p is provided. The semiconductor layer 11p may be a well region. In the semiconductor device 5, the drift layer 40 functions as a reduced surface field (RESURF) layer.

According to the semiconductor device 5 having this type of RESURF construction, the depletion layers formed in the portions of length d1 and d2 of the drift region 40 can spread more easily than in the semiconductor devices 1 through 4.

For example, the voltage difference between the source region 31 and the gate electrode 71 of the semiconductor device 5 is made to be lower than the threshold value (for example, 0 V), and a voltage (reverse bias voltage) that is positive with respect to the source region 31 is applied to the drain region 51. Then a depletion layer extends from the junction portion (pn junction Interface) between the base region 21 below the gate electrode 71 and the drift region 40 towards the base region 21 side and the drift region 40 side, and a depletion layer extends from the junction portion between the drift region 40 below the insulating layer 50a and the semiconductor layer 11b below the insulating layer 50a towards the drift region 40 side and the semiconductor layer 11p side. Also, the voltage difference between the source region 32a and the gate electrode 72 of the semiconductor device 5 is made to be lower than the threshold value (for example, 0 V), and a voltage (reverse bias voltage) that is positive with respect to the source region 32a, (or source region 32b) is applied to the drain region 51. Then a depletion layer extends from the junction portion (pn junction interface) between the base region 22 below the gate electrode 72 and the drift region 40 towards the base region 22 side and the drift region 40 side, and a depletion layer extends from the junction portion between the drift region 40 below the insulating layer 50b and the semiconductor layer 11b below the insulating layer 50b towards the drift region 40 side and the semiconductor layer 11p side.

According to the semiconductor device 5, the avalanche durability between the drain region 51 and the source region 31, which is not adjacent to a back gate region, is higher than the avalanche durability between the drain region 51 and the source regions 32a, 32b, which are adjacent to the back gate region 33. In other words, it is more difficult for element failure (avalanche breakdown) to occur between the source region 31 and the drain region 51 before it occurs between the source regions 32a, 32b and the drain region 51. In other words, by reducing the avalanche durability between the source regions 32a, 32b and the drain region 51 lower than the avalanche durability between the source region 31 and the drain region 51, avalanche breakdown can more easily occur between the source regions 32a, 32b and the drain region 51 before it occurs between the source region 31 and the drain region 51.

On the other hand, even though avalanche breakdown can occur more easily between the source regions 32a, 32b and the drain region 51 than between the source region 31 and the drain region 51, the back gate region 33 is adjacent to the source regions 32a, 32b.

Therefore, even though avalanche breakdown occurs between the source regions 32a, 32b and the drain region 51 before avalanche breakdown occurs between the source region 31 and the drain region 51, carriers (for example, holes) that are generated between the source regions 32a, 32b and the drain region 51 are efficiently discharged from the back gate region 33 to the source electrode 80B. Therefore, the margin against avalanche breakdown between the source regions 32a, 32b and the drain region 51 is increased, and as a result there is high avalanche durability. In other words, the resistance to breakdown between the source region 31 and the drain region 51, and the resistance to breakdown between the source regions 32a, 32b and the drain region 51 are both increased.

Also, avalanche breakdown is made to more easily occur between the source regions 32a, 32b and the drain region 51 than between the source region 31 and the drain region 51, so the source to drain breakdown voltage of the semiconductor device 5 can be controlled by the resistance to breakdown between the source regions 32a, 32b and the drain region 51.

To further increase BVdss between the source region 31 and the drain region 51 higher than BVdss between the source region 32a (or the source region 32b) and the drain region 51, the width S1 of the insulating layer 50a may be made longer than the width S2 of the insulating layer 50b.

Or, as in the semiconductor device 3, the impurity concentration Qd1 of the portion of the drift region 40 that is sandwiched between the base region 21 and the insulating layer 50a, and the impurity concentration Qd2 of the portion of the drift region 40 that is sandwiched between the base region 22 and the insulating layer 50b, may be designed to be different.

Or, the effect in which the gate electrodes function as field plate electrodes may be promoted more at the gate electrode 73 side than the gate electrode 74 side.

According to this construction, it is possible to make the element area smaller compared with the conventional construction, and avalanche breakdown can occur more easily between the source regions 32a, 32b and the drain region 51 than between the source region 31 and the drain region 51. Therefore, the overall avalanche durability of the semiconductor device 5 is improved.

In particular, in the semiconductor device 5, depletion layers can spread more easily than the semiconductor devices 1 through 4, so the impurity concentration of the drift region 40 can be higher than in the semiconductor devices 1 through 4. In this way, in the semiconductor device 5, it is possible to reduce further the on resistance between the source and drain.

(Sixth Embodiment)

Figure 9:
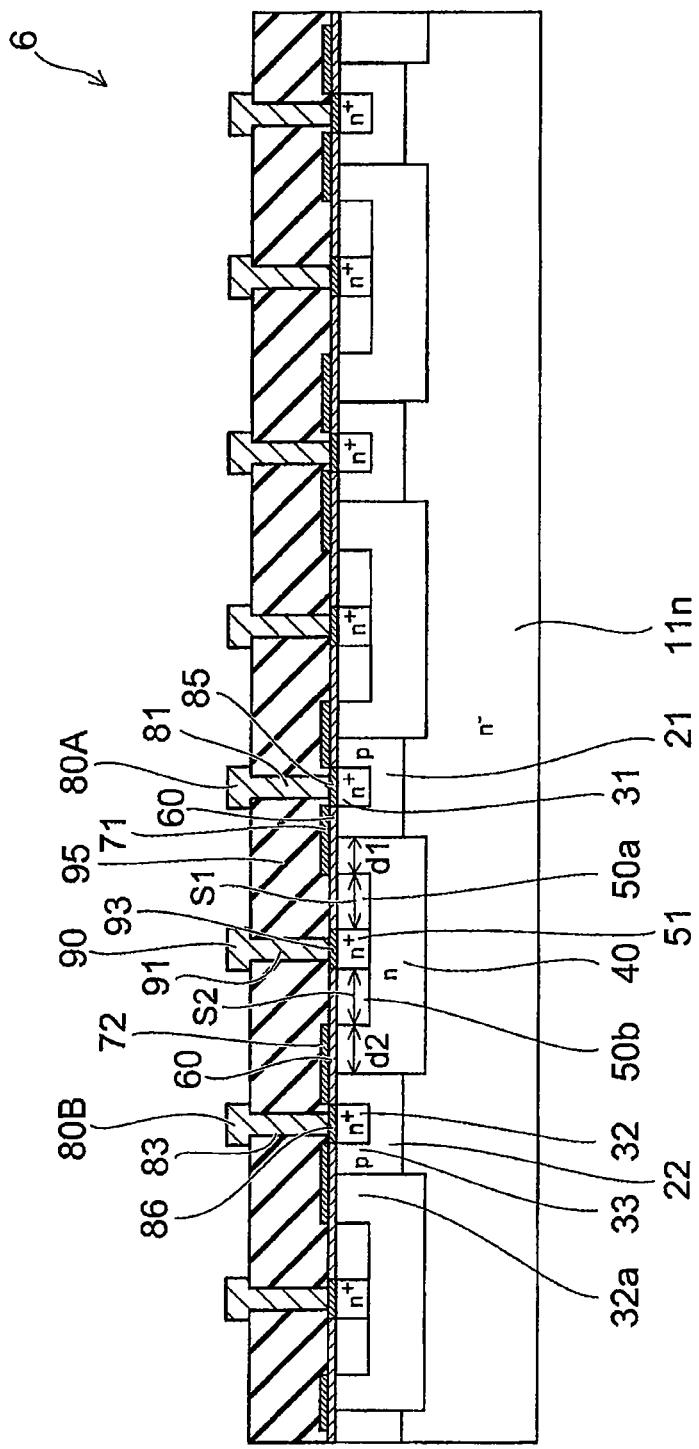
FIG. 9 is a cross-sectional view of a relevant part of a semiconductor device according to a sixth embodiment.

FIG. 9 is a cross-sectional view of a relevant part of a semiconductor device according to a sixth embodiment.

Figure 10:
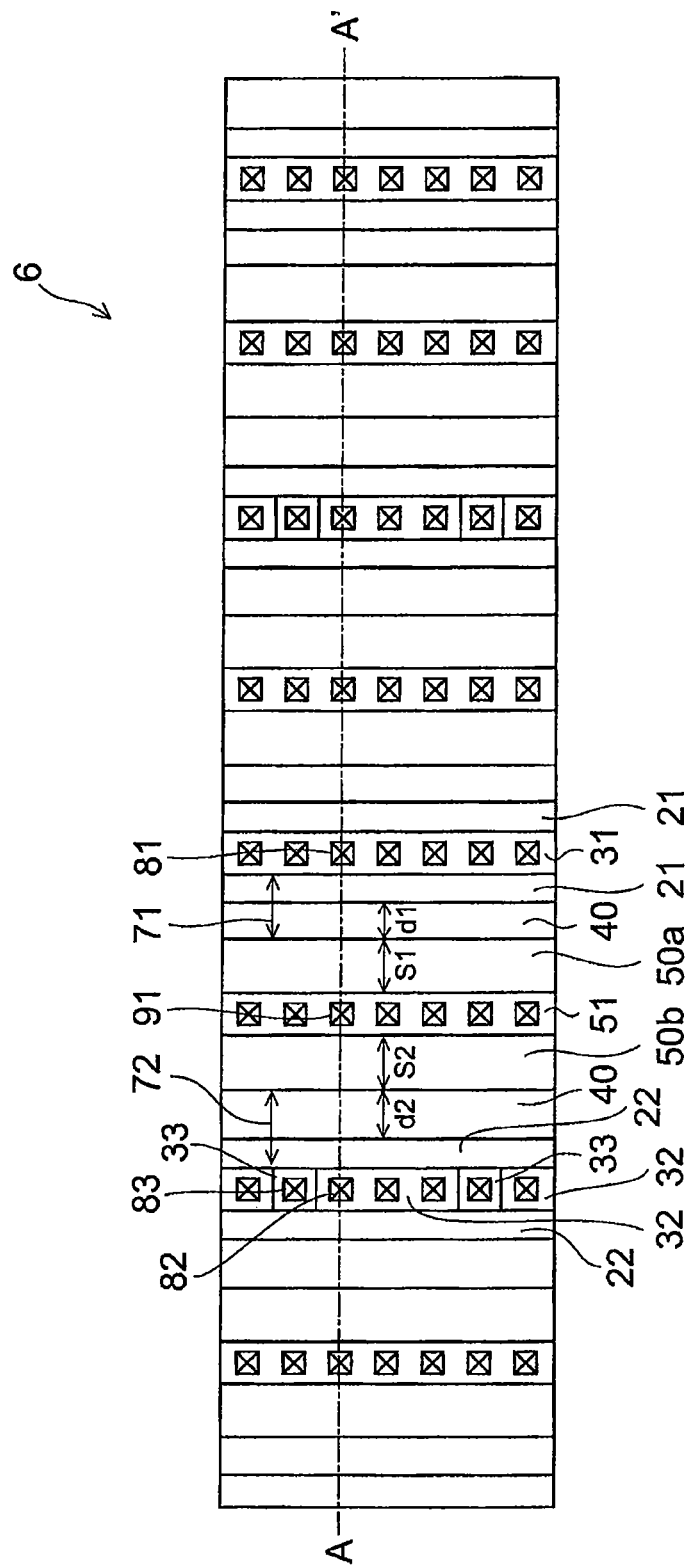
FIG. 10 is a plan view of the relevant part of a semiconductor device according to the sixth embodiment.

FIG. 10 is a plan view of the relevant part of a semiconductor device according to the sixth embodiment.

FIG. 9 illustrates the cross-section at A-A' in FIG. 10. For convenience of explaining the construction of the lower side of the gate oxide film 60 of a semiconductor device 6, the source electrodes 80A, 80B, the drain electrode 90, and the inter-layer insulating film 95 illustrated in FIG. 10 are not illustrated in FIG. 9.

The semiconductor device 6 is a lateral DMOS and includes a semiconductor layer 11n of the second conductivity type; a first base region 21 of the first conductivity type provided on the surface of the semiconductor layer 11n; a first source region 31 of the second conductivity type provided on the surface of the first base region 21; a second base region 22 of the first conductivity type provided on the surface of the semiconductor layer 11n; a second source region 32 of the second conductivity type provided on the surface of the second base region 22; and a back gate region 33 (see FIG. 10) of the first conductivity type adjacent to the second source region 32.

The semiconductor device 6 includes a source electrode 80A connected to the first source region 31; a source electrode 80B connected to the first source region 31, the second source region 32, and the back gate region 33; and a drain electrode 90 connected to the drain region 51. Both the source electrode 80A and the source electrode 80B are common source electrodes, and both the source electrode 80A and the source electrode 80B together form the first main electrode of the semiconductor device 6. The drain electrode 90 forms the second main electrode of the semiconductor device 6.

The source region 31 is connected to the source electrode 80A via a source contact region 81. The source region 32 is connected to the source electrode 80B via a source contact region 82. The back gate region 33 is connected to the source electrode 80B via a back gate contact region (not illustrated on the drawings).

Also, within the plane of the semiconductor device 6 illustrated in FIG. 10, the first source region 31 and the second source region 32 extend in a linear form. In addition, the back gate region 33, which has a conductivity type that is different from that of the source region 32, is adjacent to the source region 32.

Also, within the plane of the semiconductor device 6, the drain region 51 is provided in opposition to the source region 31 and the source region 32. The drain region 51 extends in linear form generally parallel to the source region 31 and the source region 32, and the back gate region 33. The construction in which the drain region 51 is provided between the first source region 31 and the second source region 32 is disposed repeatedly within the plane of the semiconductor device 6.

In the semiconductor device 6, in order to suppress the increase in element area, a back gate region is not disposed adjacent to the first source region 31. There is no back gate region disposed adjacent to the first source region 31. In other words, in the source regions that sandwich the drain region 51, the back gate region 33 is adjacent to one source region 32, and the back gate region 33 is not adjacent to the other source region 31. In the semiconductor device 6, in order to reduce the element area even smaller than in the semiconductor devices 1 through 5, a row is constructed with the source region 32 and the back gate region 33.

In the semiconductor device 6, the distance d1 between the opposing base region 21 and the insulating region 50a, which is the length (not more than 1.8 μm) of the portion of the drift region 40 sandwiched between the base region 21 and insulating layer 50a that can be completely depleted, is designed to be shorter than the distance d2 between the opposing base region 22 and the insulating layer 50b (d2>d1).

Also, in the semiconductor device 6, the width S1 of the insulating layer 50a in the direction from the base region 21 to the base region 22 may be approximately equal to the width S2 of the insulating layer 50b, or they may be designed so that S1>S2.

In other words, the semiconductor device 6 is designed so that d2>d1, or S2<S1, or d2>d1 and S2<S1.

According to the semiconductor device 6, the avalanche durability between the source region 31 and the drain region 51 is higher than the avalanche durability between the source region 32 and the drain region 51. In other words, it is more difficult for element failure (avalanche breakdown) to occur between the source region 31 and the drain region 51 before it occurs between the source region 32 and the drain region 51. In other words, by reducing the avalanche durability between the source region 32 and the drain region 51 lower than the avalanche durability between the source region 31 and the drain region 51, avalanche breakdown can more easily occur between the source region 32 and the drain region 51 before it occurs between the source region 31 and the drain region 51.

On the other hand, even though avalanche breakdown can occur more easily between the source region 32 and the drain region 51 than between the source region 31 and the drain region 51, the back gate region 33 is adjacent to the source region 32.

Therefore, even though avalanche breakdown occurs between the source region 32 and the drain region 51 before avalanche breakdown occurs between the source region 31 and the drain region 51, carriers (for example, holes) that are generated between the source region 32 and the drain region 51 are efficiently discharged from the back gate region 33 to the source electrode 80B. Therefore, the margin against avalanche breakdown between the source region 32 and the drain region 51 is increased, and as a result there is high avalanche durability. In other words, the resistance to breakdown between the source region 31 and the drain region 51, and the resistance to breakdown between the source region 32 and the drain region 51 are both increased.

Also, avalanche breakdown is made to more easily occur between the source region 32 and the drain region 51 than between the source region 31 and the drain region 51, so the source to drain breakdown voltage of the semiconductor device 6 can be controlled by the resistance to breakdown between the between the source region 32 and the drain region 51.

To further increase BVdss between the source region 31 and the drain region 51 higher than BVdss between the source region 32 and the drain region 51, in addition to making d2>d1, the width S1 of the insulating layer 50a may be made longer than the width S2 of the insulating layer 50b, as described previously.

Or, as in the semiconductor device 3, the impurity concentration Qd1 of the portion of the drift region 40 that is sandwiched between the base region 21 and the insulating layer 50a, and the impurity concentration Qd2 of the portion of the drift region 40 that is sandwiched between the base region 22 and the insulating layer 50b, may be designed to be different.

Or, the effect in which the gate electrodes function as field plate electrodes may be promoted more at the gate electrode 73 side than the gate electrode 74 side.

According to this construction, it is possible to make the element area smaller compared with the conventional construction, and avalanche breakdown can occur more easily between the source region 32 and the drain region 51, which is the side adjacent to the back gate region 33, than between the source region 31 and the drain region 51. Therefore, the overall avalanche durability of the semiconductor device 6 is improved. The method of arranging the back gate region 33 is not limited to the arrangement illustrated in FIG. 6, for example it may be arranged in a stripe pattern parallel to the source region 32 as illustrated in FIG. 2.

(Seventh Embodiment)

The following is a description of a method for manufacturing a semiconductor device according to an embodiment.

FIGS. 11A to 14 are cross-sectional views of relevant parts for describing a method for manufacturing a semiconductor device.

Figure 11A:
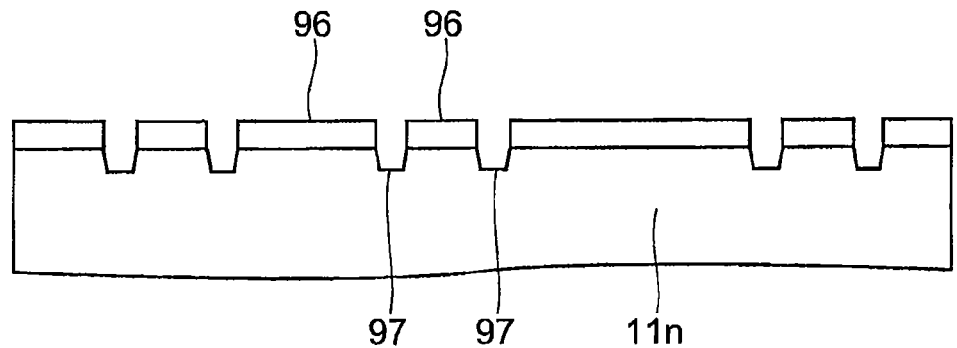
FIGS. 11A to 14 are cross-sectional views of relevant parts for describing a method for manufacturing a semiconductor device.
Figure 11B:
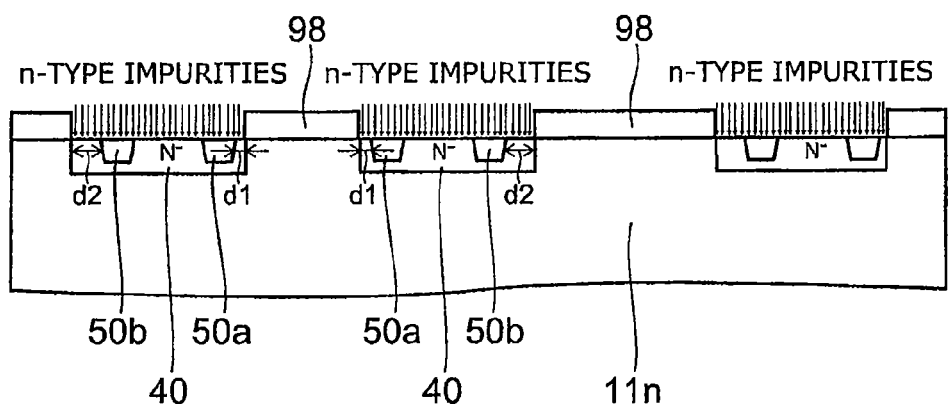

In FIGS. 11A and 11B and subsequent drawings, a semiconductor layer 11n is illustrated as an example of the substrate of the semiconductor device, but the method for manufacturing in which the semiconductor layer 11n is replaced by a semiconductor layer 11p is also included in the embodiment.

First, as illustrated in FIG. 11A, a patterned mask 96 is formed on the semiconductor layer 11n, and an etching process is carried out on the semiconductor layer 11n that is exposed from the mask 96. In this way, trenches 97 are formed in the locations where the insulating layers 50a, 50b will be formed.

Next, as illustrated in FIG. 11B, the insulating layers 50a, 50b are formed in the trenches 97 as described above. Next, a mask 98 that is selectively opened at the locations where the drift regions are to be formed is formed on the semiconductor layer 11n, and the semiconductor layer 11n is introduced with n-type impurities using the mask 98 as a screening film. In this way, the drift regions 40 are selectively formed on the surface of the semiconductor layer 11n. The insulating layers 50a, 50b are selectively provided within the drift region 40.

In the opening portions of the mask 98, in order to produce the difference in the length d1 and the length d2 as described above, a difference is produced in the opening area of the semiconductor layer 11n adjacent to the insulating layer 50a and the opening area of the semiconductor layer 11n adjacent to the insulating layer 50b. For example, the aperture region of the semiconductor layer 11n adjacent to the insulating layer 50a (the region of the distance d1) is narrower than the aperture region of the semiconductor layer 11n adjacent to the insulating layer 50b (the region of the distance d2). In this way, after forming the drift region 40 by introducing the impurities, the relationship d2>d1 between the distance d1 and the distance d2 is established. Regarding the opening portions of the mask 98, when the openings are made at least the length d1 of the length d1 and the length d2 is controlled so that it is not more than 1.8 μm.

Figure 12A:
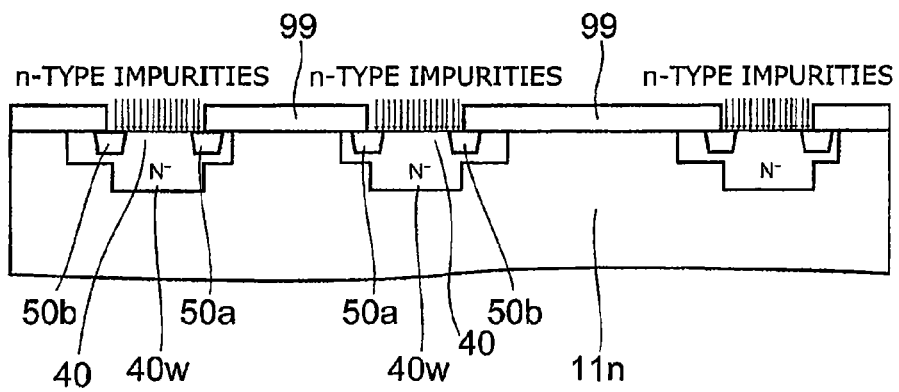

Next, as illustrated in FIG. 12A, a mask 99 that is selectively opened at the locations where n-type well regions are to be formed is formed on the semiconductor layer 11n, and the semiconductor layer 11n is introduced with n-type impurities using the mask 99 as a screening film. In this way, n-type well regions 40w are formed below the drift regions 40. The n-type well regions 40w are not illustrated on FIG. 1, for example, but n-type well regions 40w may be formed below the drift regions, as illustrated in FIG. 12A. This type of form is also included in the embodiment.

Figure 12B:
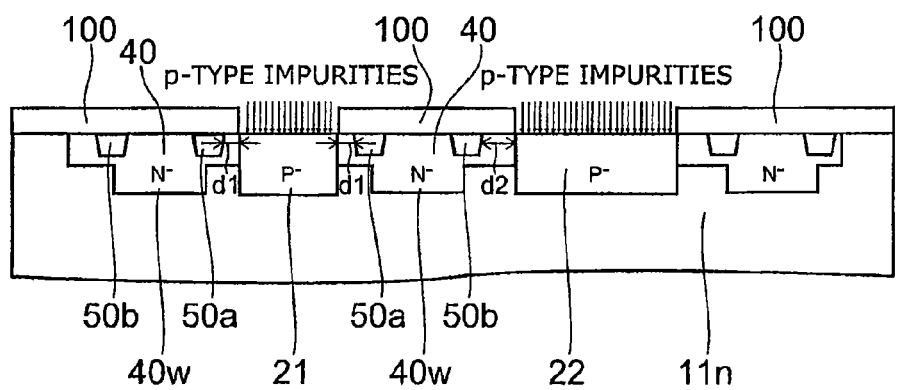

Next, as illustrated in FIG. 12B, a mask 100 that is selectively opened at the locations where the base regions are to be formed is formed on the semiconductor layer 11n, and the semiconductor layer 11n is introduced with p-type impurities using the mask 100 as a screening film. In this way, the base regions 21, 22 are selectively formed on the surface of the semiconductor layer 11*n*.

Figure 13A:
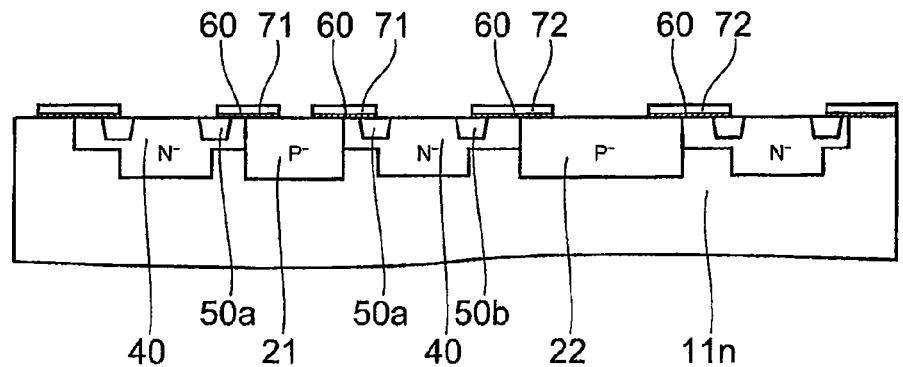

Next, as illustrated in FIG. 13A, gate oxide films 60 are selectively formed on the surface of the base region 21, the surface of the base region 22, and the surface of the drift region 40. In addition, the gate electrode 71 is formed on the gate oxide film 60 provided on the base region 21 and the drift region 40, and the gate electrode 72 is formed on the gate oxide film 60 provided on the base region 22 and the drift region 40. The selective formation of the gate electrodes and the gate oxide films is carried out by photolithography. As illustrated in the drawings, the gate electrode 71 may extend to the insulating layer 50*a*, via the gate oxide film 60 disposed therebetween. The gate electrode 72 may extend to the insulating layer 50*b*, via the gate oxide film 60 disposed therebetween.

Figure 13B:
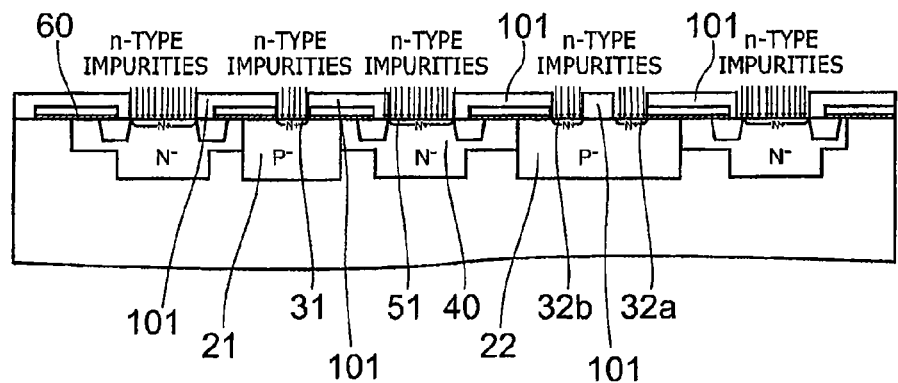

Next, as illustrated in FIG. 13B, a mask 101 that is selectively opened at the locations where the source regions and the drain regions are to be formed is formed on the semiconductor layer 11*n*, and the semiconductor layer 11*n* is introduced with n-type impurities using the mask 101 as a screening film. In this way, the source region 31 is selectively formed within the base region 21, and the source regions 32*a*, 32*b* are selectively formed within the base region 22. The drain region 51 is selectively formed between the insulating layer 50*a* and the insulating layer 50*b* within the drift region 40.

Figure 14:
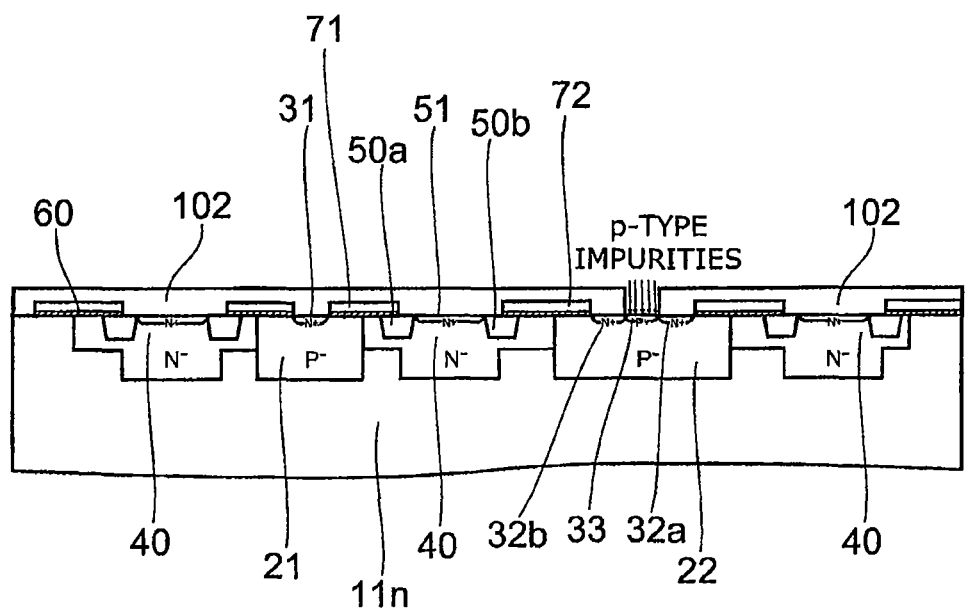

Next, as illustrated in FIG. 14, a mask 102 that is selectively opened at the locations where the back gate regions are to be formed is formed on the semiconductor layer 11*n*, and the semiconductor layer 11*n* is introduced with p-type impurities using the mask 102 as a screening film. In this way, the back gate region 33 is selectively formed on the surface of the base region 22. Then, thereafter the source contact regions 81, 82, 82*a*, 82*b*, the back gate contact region 83, the drain contact region 91, the source electrodes 80A, 80B, the drain electrode 90, the inter-layer insulating film 95, and so on, are formed, to form the semiconductor device as illustrated in FIG. 1, for example.

(Eighth Embodiment)

In order to produce the difference in the lengths d1, d2 as described above, the semiconductor device may be formed by the following manufacturing method.

FIGS. 15A to 16B are cross-sectional views of relevant parts for describing another method for manufacturing a semiconductor device.

Figure 15A:
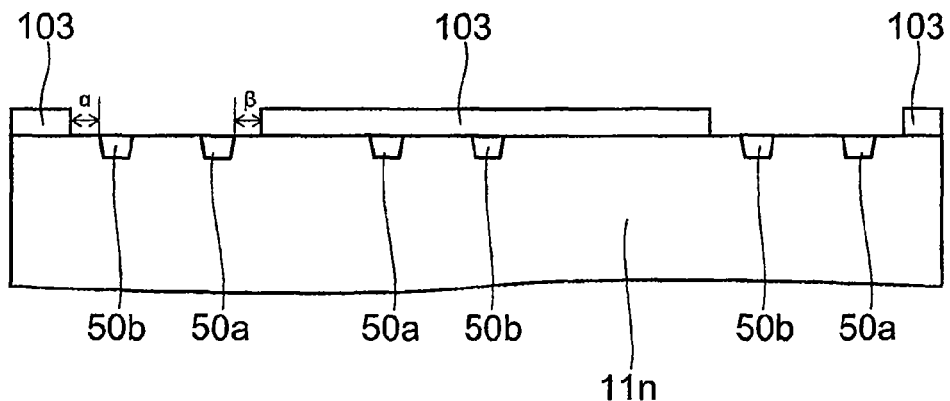
FIGS. 15A to 16B are cross-sectional views of relevant parts for describing another method for manufacturing a semiconductor device.

As illustrated in FIG. 15A, a mask 103 that is selectively opened at the locations where the drift regions are to be formed is formed on the semiconductor layer 11*n*. Regarding opening, if the insulating layers 50*a*, 50*b* are one group, the regions at every other group are opened. However, in the manufacturing method according to the embodiment, a difference is not produced in the opening area of the semiconductor layer 11*n* adjacent to the insulating layer 50*a* and the opening area of the semiconductor layer 11*n* adjacent to the insulating layer 50*b*. For example, as indicated by the arrow symbols, the opening area of a opening region α of the semiconductor layer 11*n* adjacent to the insulating layer 50*a* and the opening area of a opening region β of the semiconductor layer 11*n* adjacent to the insulating layer 50*b* are constructed approximately equal.

Figure 15B:
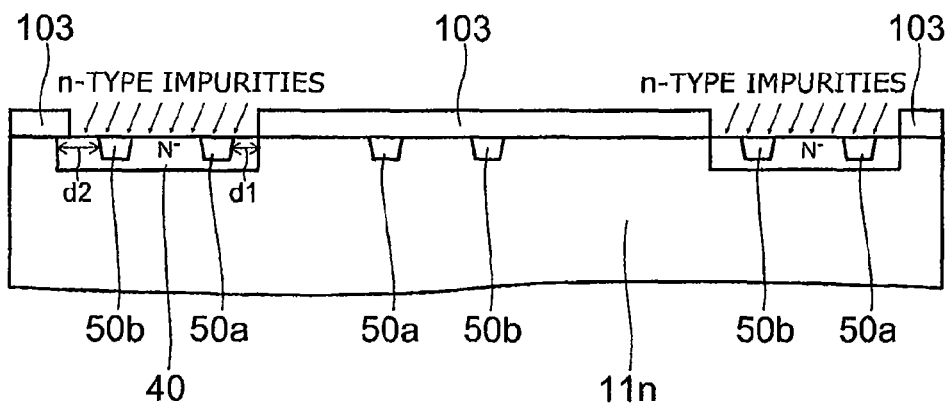

Next, as illustrated in FIG. 15B, oblique ion implantation of n-type impurities is carried out on the exposed semiconductor layer 11*n*, using the mask 103 as a screening film. For example, an ion beam that is oblique to the β side of the opening region from the normal with respect to the major surface of the semiconductor 11*n* is irradiated on the semiconductor layer 11*n*. In this way, the shielding effect of the edge of the mask 103 is greater on the opening region β side than the opening region α side, so more impurities are introduced to the opening region α side than to the opening region β side. Therefore, after forming the drift region 40, the relationship d2>d1 between the distance d1 and the distance d2 is established. The angle of inclination of the ion beam is controlled at introduction so that at least the length d1 of the length d1 and the length d2 is controlled so that it is not more than 1.8 µm.

Figure 16A:
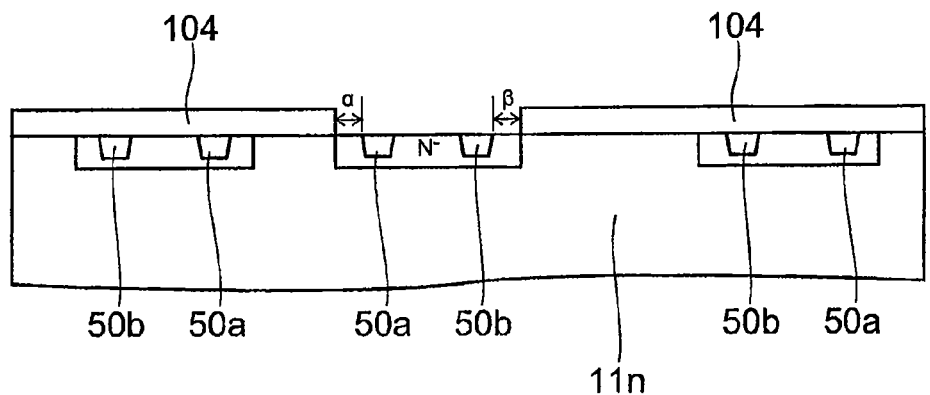

Next, in order to form further drift regions between the drift regions 40 that have been formed, as illustrated in FIG. 16A, a mask 104 that is selectively opened at the locations where the drift regions are to be formed is formed on the semiconductor layer 11*n*. The drift regions 40 that have been formed are covered by the mask 104. In the manufacturing method according to the embodiment, a difference is not produced in the opening area of the semiconductor layer 11*n* adjacent to the insulating layer 50*a* and the opening area of the semiconductor layer 11*n* adjacent to the insulating layer 50*b*. For example, as indicated by the arrow symbols, the opening area of a opening region α of the semiconductor layer 11*n* adjacent to the insulating layer 50*a* and the opening area of a opening region β of the semiconductor layer 11*n* adjacent to the insulating layer 50*b* are constructed approximately equal.

Figure 16B:
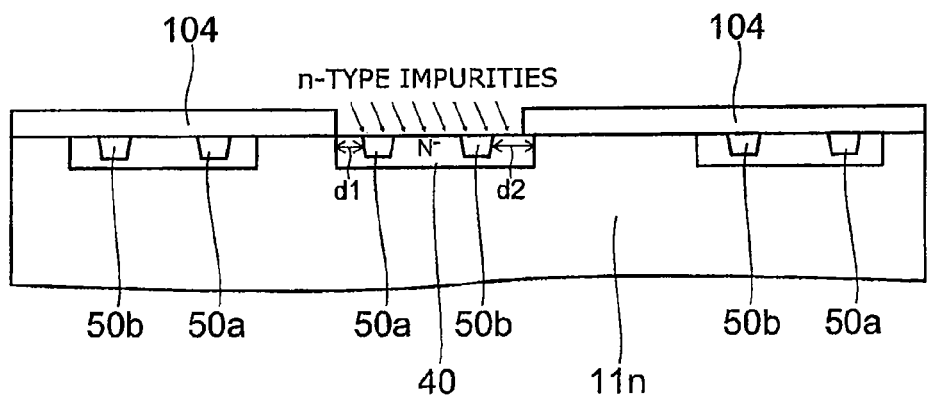

Next, as illustrated in FIG. 16B, oblique ion implantation of n-type impurities is carried out on the exposed semiconductor layer 11*n*, using the mask 104 as a screening film. For example, an ion beam that is inclined to the opening region α side of the opening region from the normal with respect to the major surface of the semiconductor layer 11*n* is irradiated on the semiconductor layer 11*n*. In this way, the shielding effect of the edge of the mask 104 is greater on the opening region α side than the opening region β side, so more impurities are introduced to the opening region β side than to the opening region α side. Therefore in this drift region 40 also the relationship d2>d1 between the distance d1 and the distance d2 is established. The angle of inclination of the ion beam is controlled at introduction so that at least the length d1 of the length d1 and the length d2 is controlled so that it is not more than 1.8 µm.

(Ninth Embodiment)

In the eighth embodiment, a method as described in which Implantation was carried out with the oblique ion implantation angle in two directions, the opening region α side and the opening region β side, but a method of manufacturing a semiconductor device with the oblique ion implantation angle from one direction is also included in the embodiment.

Figure 17A:
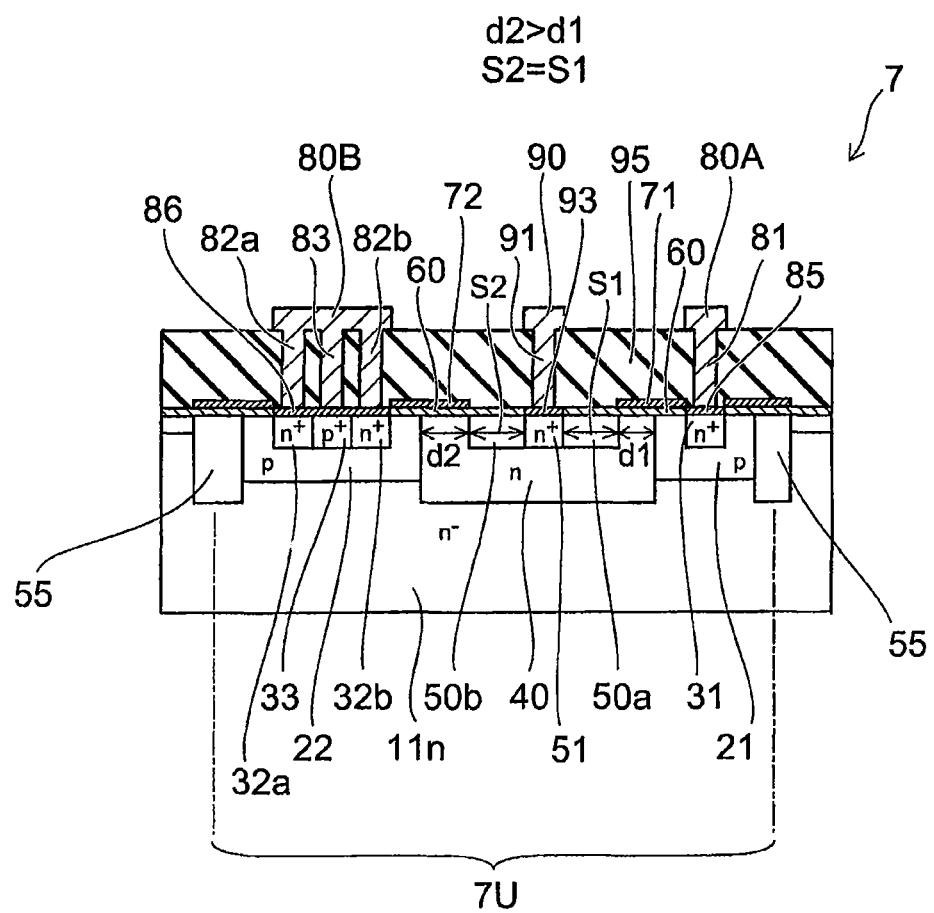
FIGS. 17A and 17B are cross-sectional views of relevant parts for describing another method for manufacturing a semiconductor device.
Figure 17B:
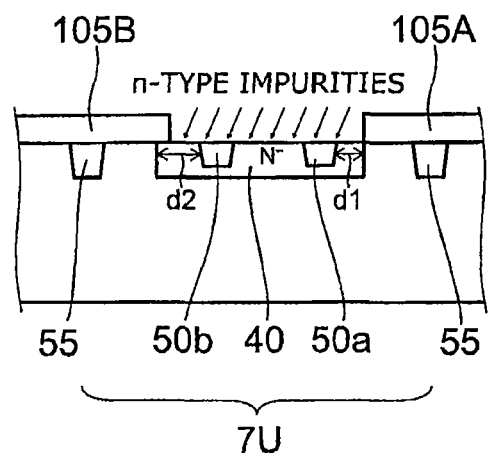

FIGS. 17A and 17B are cross-sectional views of relevant parts for describing another method for manufacturing a semiconductor device.

For example, the semiconductor device 7 ultimately formed in the ninth embodiment has a construction in which a plurality of the semiconductor device unit 7U as illustrated in FIG. 7A is disposed periodically. The element region of each unit 7U is compartmentalized (delimited) by an STI 55. With a semiconductor device 7 of this construction, it is possible to produce the difference in the lengths d1, d2 as described above by oblique ion implantation inclined in one direction.

For example, as Illustrated in FIG. 17B, masks 105A, 105B that are selectively opened at the locations where the drift regions are to be formed are formed on the semiconductor layer 11*n*. In the manufacturing method according to the embodiment, the opening area of the semiconductor layer 11*n* adjacent to the Insulating layer 50a and the opening area of the semiconductor layer 11n adjacent to the insulating layer 50b are approximately equal.

Next, oblique ion implantation of n-type impurities is carried out on the exposed semiconductor layer 11n, using the masks 105A, 105B as screening films. For example, an ion beam that is Inclined to the mask 105A side from the normal with respect to the major surface of the semiconductor 11n is irradiated on the semiconductor layer 11n. In this way, the shielding effect of the edge of the mask is greater on the mask 105A side than on the mask 105B side, so more impurities are introduced into the semiconductor layer 11n on the mask 105B side than on the mask 105A side. Therefore, after forming the drift region 40, the relationship d2>d1 between the distance d1 and the distance d2 is established. The angle of inclination of the ion beam is controlled at introduction so that at least the length d1 of the length d1 and the length d2 is controlled so that it is not more than 1.8 μm. The unit 7U is disposed periodically in the semiconductor device 7, so so when forming drift regions 40 with the relationship d2>d1, oblique ion implantation from one direction as described above is sufficient. According to this type of manufacturing process, it is possible to shorten the manufacturing process.

Embodiments of the invention with reference to examples were described above. According to the semiconductor devices 1 through 7 of the embodiments, the increase in element area is suppressed, and avalanche durability is improved. The embodiments are not limited to these examples. In other words, these examples to which a person skilled in the art to which the invention pertains has added design modifications as appropriate are also included in the scope of the invention, provided the features of the embodiments are included. For example, each of the elements included in the examples described above and their arrangement, material, conditions, shape, size, and so on is not limited to the examples described above, but can be varied as appropriate.

Also, the above embodiments were explained for the case that the first conductivity type is p-type and the second conductivity type is n-type, but constructions in which the first conductivity type is n-type and the second conductivity type is p-type are also included in the embodiments, and the same effect can be obtained. Also, various modifications can be made to the embodiments without deviating from the intent thereof. For example, the semiconductor layers 11n, 11p may be provided on a semiconductor substrate. In this case, the semiconductor layers 11p, 11n may be formed by epitaxial growth on the semiconductor substrate, or may be constituted from well layers or deep well layers provided within the semiconductor substrate.

Also, each of the elements of each of the embodiments described above can be combined within the limits of technical possibility, and these combinations also are included within the scope of the embodiments, provided the characteristics of the embodiments are included.

Furthermore, regarding the scope of the spirit of the embodiments, it is understood that a variety of variations and modifications could be conceived by a person skilled in the art and that these variations and modifications all fall within the scope of the embodiments as well.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor layer;
a first base region of a first conductivity type selectively provided on a surface of the semiconductor layer;
a first source region of a second conductivity type selectively provided on a surface of the first base region;
a second base region of the first conductivity type selectively provided on the surface of the semiconductor layer spaced from the first base region;
a second source region of a second conductivity type selectively provided on a surface of the second base region;
a back gate region of the first conductivity type provided on the surface of the second base region adjacent to the second source region;
a drift region of the second conductivity type sandwiched between the first base region and the second base region and selectively provided on the surface of the semiconductor layer;
a drain region of the second conductivity type selectively provided on a surface of the drift region;
a first insulating region provided to an interior from the surface of the drift region and facing the first base region via a portion of the drift region disposed;
a second insulating region provided to the interior from the surface of the drift region and facing the second base region via a portion of the drift region disposed, the drain region being sandwiched between the first insulating region and the second insulating region;
a first gate oxide film provided on the surface of the first base region;
a second gate oxide film provided on the surface of the second base region;
a first gate electrode provided on the first base region and the drift region via the first gate oxide film;
a second gate electrode provided on the second base region and the drift region via the second gate oxide film;
a first main electrode connected to the first source region, the second source region, and the back gate region; and
a second main electrode connected to the drain region,
a distance between the first base region and the first insulating region being not more than 1.8 μm, the first base region facing the first insulating region via a portion of the drift region and
the distance between the first base region and the first insulating region being shorter than a distance between the second base region and the second insulating region, the first base region facing the first insulating region via a portion of the drift region, the second base region facing the second insulating region via a portion of the drift region.

2. The device according to claim 1, wherein the first source region and the second source region extend generally in parallel in a direction generally normal to a direction in which the first base region and the second base region face when viewed in a direction normal to a major surface of the semiconductor layer.

3. The device according to claim 1, wherein the back gate region is disposed adjacent to the second source region in a direction in which the first base region and the second base region face when viewed in a direction normal to a major surface of the semiconductor layer.

4. The device according to claim 1, wherein the back gate region and the second source region are disposed generally in parallel in a direction generally normal to a direction in which the first base region and the second base region face when viewed in a direction normal to a major surface of the semiconductor layer.

5. The device according to claim 1, wherein the drain region extends generally parallel to the first source region and the second source region in a direction generally normal to a direction in which the first base region and the second base region face when viewed in a direction normal to a major surface of the semiconductor layer.

6. The device according to claim 1, wherein a pair of the second source region and the drain region is disposed on one side of the first source region and one other pair of the second source region and the drain region is disposed on one other side of the first source region, when viewed in a direction normal to a major surface of the semiconductor layer.

7. The device according to claim 1, wherein a distance of the first insulating region between the drift region adjacent to the first base region and the drain region is approximately equal to a distance of the second insulating region between the drift region adjacent to the second base region and the drain region.

8. The device according to claim 1, wherein a distance of the first insulating region between the drift region adjacent to the first base region and the drain region is longer than a distance of the second insulating region between the drift region adjacent to the second base region and the drain region.

9. The device according to claim 1, wherein the impurity concentration in the drift region sandwiched between the first base region and the first insulating region is different from the impurity concentration in the drift region sandwiched between the second base region and the second insulating region.

10. The device according to claim 1, wherein the first gate electrode extends from above the first gate oxide film to above the first insulating region in the direction from the first base region towards the drain region.

11. The device according to claim 1, wherein the back gate region is disposed adjacent to the second source region, and there is no back gate region disposed adjacent to the first source region.

12. The device according to claim 1, wherein the conductivity type of the semiconductor layer is the first conductivity type.

13. The device according to claim 1, wherein the back gate region is disposed adjacent to the second source region in a direction generally normal to a direction in which the first base region and the second base region face when viewed in a direction normal to a major surface of the semiconductor layer.

14. The device according to claim 1, wherein the back gate region is disposed adjacent to the second source region in a direction generally normal to a direction in which the first base region and the second base region face when viewed in a direction normal to a major surface of the semiconductor layer.

15. A semiconductor device, comprising: a semiconductor layer;
   a first base region of a first conductivity type selectively provided on the surface of the semiconductor layer;
   a first source region of a second conductivity type selectively provided on the surface of the first base region;
   a second base region of the first conductivity type selectively provided on the surface of the semiconductor layer spaced from the first base region;
   a second source region of a second conductivity type selectively provided on the surface of the second base region;
   a back gate region of the first conductivity type provided on the surface of the second base region adjacent to the second source region;
   a drift region of the second conductivity type sandwiched between the first base region and the second base region and selectively provided on the surface of the semiconductor layer;
   a drain region of the second conductivity type selectively provided on a surface of the drift region;
   a first insulating region provided to an interior from the surface of the drift region and facing the first base region via a portion of the drift region disposed;
   a second insulating region provided to the interior from the surface of the drift region and facing the second base region via a portion of the drift region disposed, the drain region being sandwiched between the first insulating region and the second insulating region;
   a first gate oxide film provided on the surface of the first base region;
   a second gate oxide film provided on the surface of the second base region;
   a first gate electrode provided on the first base region and the drift region via the first gate oxide film;
   a second gate electrode provided on the second base region and the drift region via the second gate oxide film;
   a first main electrode connected to the first source region, the second source region, and the back gate region; and
   a second main electrode connected to the drain region,
   a distance between the first base region and the first insulating region being not more than 1.8 µm, the first base region facing the first insulating region via a portion of the drift region and a distance between the second base region and the second insulating region being not more than 1.8 µm, the second base region facing the second insulating region via a portion of the drift region, and
   a distance of the first insulating region between the drift region adjacent to the first base region and the drain region is longer than a distance of the second insulating region between the drift region adjacent to the second base region and the drain region.

16. The device according to claim 15, wherein the impurity concentration in the drift region sandwiched between the first base region and the first insulating region is different from the impurity concentration in the drift region sandwiched between the second base region and the second insulating region.

17. The device according to claim 15, wherein the first gate electrode extends from above the first gate oxide film to above the first insulating region in the direction from the first base region towards the drain region.

18. The device according to claim 15, wherein the back gate region is disposed adjacent to the second source region, and there is no back gate region disposed adjacent to the first source region.

19. The device according to claim 15, wherein the back gate region and the second source region are disposed generally in parallel in a direction generally normal to a direction in which the first base region and the second base region face when viewed in a direction normal to a major surface of the semiconductor layer.

20. The device according to claim 15, wherein the back gate region is disposed adjacent to the second source region in a direction in which the first base region and the second base region face when viewed in a direction normal to a major surface of the semiconductor layer.

* * * * *